United States Patent [19]

Iyogi et al.

[11] Patent Number: 5,041,700
[45] Date of Patent: Aug. 20, 1991

[54] CIRCUIT BOARD INCLUDING AN ALUMINUM NITRIDE SUBSTRATE AND A MULTILAYERED METAL OXYNITRIDE STRUCTURE

[75] Inventors: Kiyoshi Iyogi; Takaaki Yasumoto, both of Kawasaki; Toshirou Yanazawa, Yokohama; Nobuo Iwase, Kamakura, all of Japan

[73] Assignee: Kabushiki Kaisha Toshiba, Kawasaki, Japan

[21] Appl. No.: 588,928

[22] Filed: Sep. 27, 1990

[30] Foreign Application Priority Data

Sep. 14, 1990 [JP] Japan ................................. 1-249080

[51] Int. Cl.$^5$ ............................................. H05K 1/00
[52] U.S. Cl. ..................................... 174/255; 174/256
[58] Field of Search .............. 174/255, 256, 257, 258, 174/259

[56] References Cited

U.S. PATENT DOCUMENTS

| | | |
|---|---|---|
| 4,906,511 | 3/1990 | Sato ....................................... 174/256 |
| 4,908,348 | 3/1990 | Hung ...................................... 174/256 |
| 4,963,701 | 10/1990 | Yasumoto .............................. 174/256 |

Primary Examiner—Leo P. Picard
Assistant Examiner—Trinidad Korka
Attorney, Agent, or Firm—Oblon, Spivak, McClelland, Maier & Neustadt

[57] ABSTRACT

A circuit board includes an aluminum nitride substrate, and a circuit pattern formed on the substrate and having a multilayered structure in which a metal oxynitride layer represented by formula $Al_uM1_vM2_xO_yN_z$ (wherein M1 represents a metal selected from the group consisting of Ti, Cr, Ta, and Zr, M2 represents a metal selected from the group consisting of Ni, Pt, Pd, W, Nb, and Mo, u represents 3 to 50 atm %, v represents 3 to 78 atm %, x represents 0 to 50 atm %, y represents 0.005 to 25 atm %, and z represents 5 to 70 atm %), a bonding layer consisting essentially of a metal represented by M1, a barrier layer consisting essentially of a metal represented by M2, and a conductor layer consisting essentially of Au are stacked in the order named.

20 Claims, 2 Drawing Sheets

CIRCUIT BOARD INCLUDING AN ALUMINUM NITRIDE SUBSTRATE AND A MULTILAYERED METAL OXYNITRIDE STRUCTURE

BACKGROUND OF THE INVENTION

1. Field of the Invention

The present invention relates to a circuit board consisting of aluminum nitride (AlN) as a substrate and, more particularly, to a circuit board suitable for forming a module by mounting a semiconductor integrated circuit chip such as an IC or a LSI.

2. Description of the Related Art

Alumina is conventionally mainly used as a substrate of a circuit board for forming a semiconductor integrated circuit chip into a module. As the performance of an integrated circuit chip such as an LSI to be mounted is improved, however, an amount of heat generated by the chip during an operation is increased, and the number of chips to be mounted is limited due to a thermal conductivity of alumina.

For this reason, a circuit board using, as its substrate, BeO having a high thermal conductivity in place of alumina has been used. Since, however, BeO has strong toxicity, its application range as a substrate is limited. Therefore, an AlN sintered product is widely used as a substitute material.

The AlN sintered product is harmless and therefore is not limited in its manufacture, parts formation, and disposal. In addition, the AlN sintered product has a wide thermal conductivity range of 70 to 280 W/m.K and heat radiation properties which can be adjusted from a value 3.5 times that of alumina to a level higher than that of BeO. Therefore, not only a circuit board using an AlN sintered product can realize a packing density higher than that of a circuit board using an alumina substrate, but also a desired thermal conductivity can be imparted in accordance with a high packing density of a semiconductor integrated circuit chip.

Two types of circuit boards are known which have an AlN substrate. A circuit board of the first type is disclosed in Published Unexamined Japanese Patent Application No. 1-223737 (Fukushima et al.). This circuit board has a structure in which a three-layered circuit pattern obtained by sequentially stacking a first layer consisting of at least one member selected from the group consisting of Ti, Cr, Mo, and W, a second layer consisting of Ni or Cu, and a third layer consisting of Au is formed on the surface of an AlN substrate.

A circuit board of the second type is disclosed in Published Unexamined Japanese Patent Application No. 62-182183 (Sasame et al.). In this circuit board, an aluminum oxide layer is formed on the surface of the AlN substrate, and a three-layered circuit pattern formed by sequentially stacking a first layer consisting of Ti, a second layer consisting of Mo or Pt, and a third layer consisting of Au is formed on the aluminum oxide layer.

In each circuit boards having these structure, however, since a bonding strength between the AlN substrate and the circuit pattern is unsatisfactory, the circuit pattern is peeled or disconnected from the substrate surface. In addition, in the AlN substrate, an etching rate changes in accordance with a crystal orientation, and a step is formed between grain boundaries having different crystal orientations. Therefore, when the bonding strength of the circuit pattern with respect to the substrate is unsatisfactory, the circuit pattern is disconnected on the step.

SUMMARY OF THE INVENTION

It is an object of the present invention to provide a circuit board which can efficiently radiate heat generated by a mounted IC chip or LSI chip.

It is another object of the present invention to provide a circuit board having a structure in which a good circuit pattern having a high bonding strength and free from peeling or disconnection during a temperature cycle is formed on an AlN substrate.

It is still another object of the present invention to provide a circuit board having a structure in which a circuit pattern is formed on an AlN substrate, and lead are strongly bonded, via a brazing material layer, to lead bonding regions electrically connected to the circuit pattern.

It is still another object of the present invention to provide a circuit board having a structure in which a seal frame is strongly bonded, via a brazing material layer, to a frame-like pattern formed on an AlN substrate.

According to the present invention, there is provided a circuit board comprising:

a substrate consisting of aluminum nitride; and a circuit pattern formed on the substrate and having a multilayered structure in which a metal oxynitride layer represented by formula $Al_uM1_vM2_xO_yN_z$ (wherein M1 represents a metal selected from the group consisting of Ti, Cr, Ta, and Zr, M2 represents a metal selected from the group consisting of Ni, Pt, Pd, W, Nb, and Mo, u represents 3 to 50 atm%, v represents 3 to 78 atm%, x represents 0 to 50 atm%, y represents 0.005 to 25 atm%, and z represents 5 to 70 atm%), a bonding layer consisting essentially of a metal represented by M1, a barrier layer consisting essentially of a metal represented by M2, and a conductor layer consisting essentially of Au are sequentially stacked in the order named.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 1:
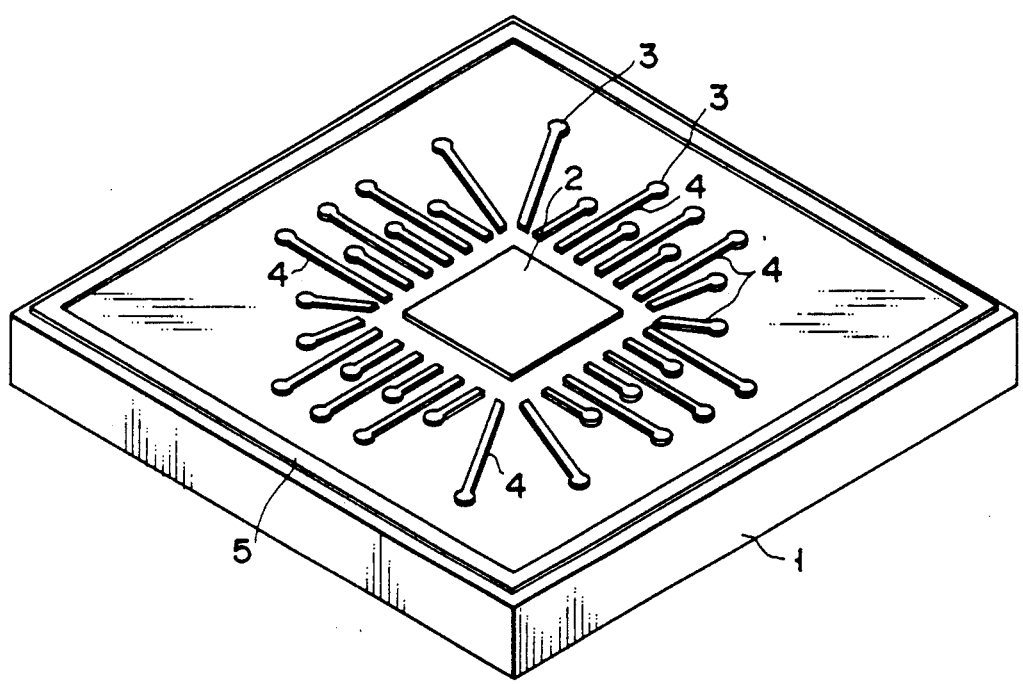
FIG. 1 is a perspective view showing a circuit board according to the present invention.

A circuit board according to the present invention will be described in detail below with reference to FIG. 1.

A circuit pattern 2 serving as an island portion on which a semiconductor integrated circuit chip is to be mounted is formed on the surface of an AlN substrate 1.

A plurality of circuit patterns 4 each having a land portion 3 at its end are formed on the substrate 1. A plurality of via fillings (not shown) consisting of, e.g., tungsten are buried in holes formed in the substrate 1. The via fillings are connected to the land portions 3, respectively, formed on the surface of the substrate 1. A plurality of lead bonding regions, e.g., pin bonding regions (not shown) are formed on the lower surface of the substrate 1. The pin bonding regions are connected to the via fillings respectively. A frame-like pattern 5 the for bonding a seal frame is formed on the periphery of surface of the substrate 1.

The AlN substrate 1 preferably has an oxygen content of 0.001 to 10 atm% and a thermal conductivity of 130 to 280 W/m.K. The oxygen content is limited for the following reason. That is, if the oxygen content in the substrate is less than 0.001 atm%, it is difficult to satisfactorily increase a bonding strength with respect to an undercoating layer. If the oxygen content is more than 10 atm%, the thermal conductivity of the AlN substrate is decreased to be equal to that of alumina, thereby degrading an advantage of high thermal conductivity.

The circuit pattern 2 and the circuit patterns 4 each having the land portion 3 at its end are constituted to have multilayered structures to be described in the following items (i) and (ii).

(i) A multilayered structure in which a metal oxynitride layer represented by formula $Al_uM1_vM2_xO_yN_z$ (wherein M1 represents a metal selected from the group consisting of Ti, Cr, Ta, and Zr, M2 represents a metal selected from the group consisting of Ni, Pt, Pd, W, Nb, and Mo, u represents 3 to 50 atm%, v represents 3 to 78 atm%, x represents 0 to 50 atm%, y represents 0.005 to 25 atm%, and z represents 5 to 70 atm%), a bonding layer consisting essentially of a metal represented by M1, a barrier layer consisting essentially of a metal selected from the group consisting of Ni, Pt, Pd, W, Nb, and Mo, and a conductor layer consisting essentially of Au are sequentially stacked on the substrate in the order named.

The metal oxynitride layer is used to increase a bonding strength of the bonding layer with respect to the AlN substrate and to prevent the bonding layer from being peeled from the metal oxynitride layer during a thermal cycle. More specifically, Al as a component of the metal oxynitride layer has an effect of increasing the bonding strength of the bonding layer with respect to the AlN substrate. M1 has a high reactivity with Al, oxygen, and nitrogen and therefore has an effect of increasing the bonding strength of the bonding layer with respect to the AlN substrate. M2 has a high reactivity with Al, M1, oxygen, and nitrogen as other components of the metal oxynitride layer and also has a high reactivity with the component of the barrier layer. Therefore, M2 has an effect of further increasing the bonding strength of the bonding layer with respect to the AlN substrate. O and N as other components of the metal oxynitride layer have an effect of matching lattice constants between the AlN substrate and the bonding layer and an effect of relaxing a thermal expansion difference therebetween. A ratio (atm%) of each component of the metal oxynitride layer is limited for the following reason.

(1) If the ratio (u) of Al is less than 3 atm%, the bonding strength of the bonding layer with respect to the AlN substrate cannot be satisfactorily increased. If the ratio of Al is more than 50 atm%, an Al amount in the metal oxynitride layer is increased to disturb a mixing balance with other components M1, M2, O and N. As a result, the effects of matching lattice constants and relaxing a thermal expansion difference between the AlN substrate and the bonding layer cannot be obtained. More preferably, the ratio of Al is 8 to 42 atm%.

(2) If the ratio (v) of M1 is less than 3 atm%, the bonding strength of the bonding layer with respect to the AlN substrate cannot be satisfactorily increased. If the ratio of M1 is more than 78 atm%, an M1 amount in the metal oxynitride layer is increased to disturb a mixing balance with other components Al, M2, O and N. As a result, the effects of matching lattice constants and relaxing a thermal expansion difference between the AlN substrate and the bonding layer cannot be obtained. More preferably, the ratio of M1 is 7 to 65 atm%. In addition, Ti is most preferably selected as M1.

(3) When M2 is used as a component of the metal oxynitride layer, its ratio (x) is set to be 0.0001 to 50 atm%. The ratio of M2 is limited for the following reason. That is, if the ratio (x) of M2 is less than 0.0001 atm%, the bonding strength cannot be satisfactorily increased even after M2 is mixed. If the ratio of M2 is more than 50 atm%, an M2 amount in the metal oxynitride layer is increased to disturb a mixing balance with other components Al, M1, O and N. As a result, the effects of matching lattice constants and relaxing a thermal expansion difference between the AlN substrate and the bonding layer cannot be obtained. More preferably, the ratio of M2 is 0.0001 to 47 atm%. In addition, Ni is most preferably selected as M2.

(4) If the ratio (y) of O is less than 0.005 atm%, a thermal expansion difference between the AlN substrate and the bonding layer is increased, and the bonding layer is peeled from the metal oxynitride layer due to a thermal stress generated during a thermal cycle. If the ratio of O is more than 25 atm%, a degree of mismatching of lattice constants between the AlN substrate and the bonding layer is increased to cause peeling of the bonding layer. More preferably, the ratio of O is 3 to 20 atm%.

(5) If the ratio (z) of N is less than 5 atm%, a degree of mismatching of lattice constants between the AlN substrate and the bonding layer is increased, and the bonding layer is peeled from the metal oxynitride layer. If the ratio of N is more than 70 atm%, a thermal expansion difference between the AlN substrate and the bonding layer is increased, and the bonding layer is peeled due to a thermal stress generated during a thermal cycle. More preferably, the ratio of N is 10 to 40 atm%.

The thickness of the metal oxynitride layer is preferably 3 nm or more for the following reason. That is, if the thickness of the metal oxynitride layer is less than 3 nm, it is difficult to stably increase the bonding strength between the AlN substrate and the bonding layer. The upper limit of the thickness of the metal oxynitride layer is preferably 500 nm, for the purpose of suppressing the side-etching during the patterning of the metal oxynitride layer, and also rendering the circuit board thinner. More preferably, the thickness of the metal oxynitride layer is 10 to 350 nm.

The bonding layer is used to increase a bonding strength of the barrier layer with respect to the metal oxynitride layer. The bonding layer most preferably consists of Ti. The thickness of the bonding layer is preferably 5 to 900 nm for the following reason. That is, if the thickness of the bonding layer is less than 5 nm, the metal of the layer cannot reacts adequately with the metal oxynitride, and the bonding strength with respect to the metal oxynitride layer is inevitably insufficient. If the thickness of the bonding layer exceeds 900 nm, since an internal stress of the bonding layer is increased, the bonding layer is easily peeled from the metal oxynitride layer. More preferably, the thickness of the bonding layer is 10 to 500 nm.

The barrier layer has an effect of preventing mutual diffusion between the bonding layer and the Au conductor layer which are vertically stacked. The barrier layer most preferably consists of Ni. The thickness of the barrier layer is preferably 10 nm to 1 μm, and more preferably, 50 to 700 nm for the following reason. If the thickness of the barrier layer is less than 10 nm, it is difficult to satisfactorily achieve its barrier effect. If the thickness of the barrier layer is more than 1 μm, since an internal stress of the barrier layer is increased, the barrier layer is peeled from the bonding layer, or it is difficult to form a highly reliable circuit pattern since a side-etching degree is increased upon etching performed during patterning. More preferably, the thickness of the barrier layer is 30 to 700 nm.

The thickness of the conductor layer is preferably 100 nm to 20 μm in consideration of a conductivity of the circuit pattern.

(ii) A multilayered structure in which an undercoating layer represented by formula $Al_uM1_vM2_wAu_xO_yN_z$ (wherein M1 represents a metal selected from the group consisting of Ti, Cr, Ta, and Zr, M2 represents a metal selected from the group consisting of Ni, Pt, Pd, W, Nb, and Mo, u represents 0.1 to 40 atm%, v represents 0.5 to 50 atm%, w represents 0.1 to 50 atm%, x represents 0.05 to 30 atm%, y represents 0 to 20 atm%, and z represents 0.1 to 40 atm%) and a main layer represented by formula $M1_wM2_xAu_yO_z$ (wherein M1 represents a metal selected from the group consisting of Ti, Cr, Ta, and Zr, M2 represents a metal selected from the group consisting of Ni, Pt, Pd, W, Nb, and Mo, w represents 0.5 to 50 atm%, x represents 0.1 to 50 atm%, y represents 0.1 to 80 atm%, and z represents 0 to 1.5 atm%) are stacked on the substrate in the order named.

The undercoating layer is used to increase a bonding strength of the main layer with respect to the AlN substrate and to prevent the main layer from being peeled from the undercoating layer during a thermal cycle. More specifically, Al as a component of the undercoating layer has an effect of increasing the bonding strength of the main layer with respect to the AlN substrate. M1 has a high reactivity with Al, oxygen, and nitrogen and therefore has an effect of increasing the bonding strength of the main layer with respect to the AlN substrate. M2 has a high reactivity with Al, M1, oxygen, and nitrogen as other components of the undercoating layer and therefore has an effect of further increasing the bonding strength of the main layer with respect to the AlN substrate. Au has an effect of forming a compound with metals represented by M1 and M2 to further increase the bonding strength of the main layer with respect to the AlN substrate. O and N as other components of the undercoating layer have an effect of matching lattice constants between the AlN substrate and the main layer and an effect of relaxing a thermal expansion difference therebetween. A ratio (atm%) of each component of the undercoating layer is limited for the following reason.

(1) If the ratio (u) of Al is less than 0.1 atm%, the bonding strength of the main layer with respect to the AlN substrate cannot be satisfactorily increased. If the ratio of Al is more than 40 atm%, an Al amount in the undercoating layer is increased to disturb a mixing balance with other components M1, M2, Au, O, and N. As a result, the effects of matching lattice constants and relaxing a thermal expansion difference between the AlN substrate and the main layer cannot be obtained. More preferably, the ratio of Al is 0.2 to 36 atm%.

(2) If the ratio (v) of M1 is less than 0.5 atm%, the bonding strength of the main layer with respect to the AlN substrate cannot be satisfactorily increased. If the ratio of M1 is more than 50 atm%, an M1 amount in the undercoating layer is increased to disturb a mixing balance with other components Al, M2, Au, O, and N. As a result, the effects of matching lattice constants and relaxing a thermal expansion difference between the AlN substrate and the main layer cannot be obtained. More preferably, the ratio of M1 is 0.7 to 45 atm%. In addition, Ti is most preferably selected as M1.

(3) If the ratio (w) of M2 is less than 0.1 atm%, the bonding strength of the main layer with respect to the AlN substrate cannot be satisfactorily increased. If the ratio of M2 is more than 50 atm%, an M2 amount in the undercoating layer is increased to disturb a mixing balance with other components Al, M1, Au, O, and N. As a result, the effects of matching lattice constants and relaxing a thermal expansion difference between the AlN substrate and the main layer cannot be obtained. More preferably, the ratio of M2 is 0.1 to 45 atm%. In addition, Ni is most preferably selected as M2.

(4) If the ratio (x) of Au is less than 0.05 atm%, an amount of the compound produced by a reaction with the metals represented by M1 and M2 is decreased to make it difficult to satisfactorily increase the bonding strength between the AlN substrate and the main layer. If the ratio of Au is more than 30 atm%, a production amount of an intermetallic compound which degrades bonding properties is increased to decrease the bonding strength between the AlN substrate and the main layer.

(5) When O is used as a component of the undercoating layer, its ratio (y) is set to be 0.0001 to 20 atm%. The ratio of O is limited for the following reason. That is, if the ratio of O is less than 0.0001 atm%, the effect of decreasing a thermal expansion difference between the AlN substrate and the main layer to prevent the main layer from being peeled due to a thermal stress generated during a thermal cycle cannot be obtained. If the ratio of O is more than 20 atm%, a degree of mismatching of lattice constants between the AlN substrate and the main layer is increased to cause peeling of the main layer. More preferably, the ratio of O is 0.0001 to 17 atm%.

(6) If the ratio (z) of N is less than 0.1 atm%, a degree of mismatching of lattice constants between the AlN substrate and the main layer is increased to cause peeling of the main layer. If the ratio of N is more than 40 atm%, a thermal expansion difference between the AlN substrate and the main layer is increased, and the main layer is peeled due to a thermal stress generated during a thermal cycle. More preferably, the ratio of N is 0.2 to 37 atm%.

The thickness of the undercoating layer is preferably 3 nm or more for the following reason. That is, if the thickness of the undercoating layer is less than 3 nm, it is difficult to stably increase the bonding strength between the AlN substrate and the main layer. The upper limit of the thickness of the undercoating layer is preferably 500 nm, for the purpose of suppressing the side-etching during the patterning of the undercoating layer, and also rendering the circuit board thinner. More preferably, the thickness of the undercoating layer is 8 to 500 nm.

The main layer is used as a conductor portion of the circuit pattern. More specifically, M1 and M2 as a component of the main layer have an effect of increasing a bonding strength with respect to the undercoating layer. Au has an effect of decreasing a resistance of the main layer. O has an effect of further increasing the bonding strength with respect to the undercoating layer. A ratio (atm%) of each component of the main layer is limited for the following reason.

(1) If the ratio (w) of M1 is less than 0.5 atm%, the bonding strength with respect to the undercoating layer is decreased. If the ratio of M1 is more than 50 atm%, the resistance is increased to degrade the function as a conductor portion. More preferably, the ratio of M1 is 0.7 to 45 atm%. In addition, Ti is most preferably selected as M1.

(2) If the ratio (x) of M2 is less than 0.1 atm%, the bonding strength with respect to the undercoating layer is decreased. If the ratio of M1 is more than 50 atm%, the resistance is increased to degrade the function as a conductor portion. In addition, when a pad portion of a mounted IC chip or the like is to be bonded by an Au or Al wire, bonding properties of the wire with respect to the main layer are degraded. More preferably, the ratio of M2 is 0.3 to 50 atm%. In addition, Ni is most preferably selected as M2.

(3) If the ratio (y) of Au is less than 0.1 atm%, the resistance of the main layer cannot be decreased to degrade the function as a conductor portion. If the ratio of Au is more than 80 atm%, a mixing balance with other components M1, M2, and O is disturbed to decrease the bonding strength with respect to the undercoating layer. More preferably, the ratio of Au is 0.5 to 80 atm%.

(4) When O is used as a component of the main layer, its ratio (z) is set to be 0.0001 to 1.5 atm%. The ratio of O is limited for the following reason. That is, if the ratio of O is less than 0.0001 atm%, the bonding strength with respect to the undercoating layer cannot be increased. If the ratio of O is more than 1.5 atm%, 0 reacts with M1 and M2 to form an oxide layer on the surface of the main layer to increase the surface resistance, thereby degrading the function as a conductor portion. More preferably, the ratio of O is 0.0001 to 1.2 atm%.

The thickness of the main layer is preferably 300 nm to 10 μm. This is because, if the main layer is less than 300 nm thick, it can hardly have a uniform bonding strength with respect firmly to the undercoating layer. Conversely, if the main layer is more than 10 μm, the etching efficiency, which it must have during the etching, will decrease, making it difficult to form a fine circuit pattern.

Note that the circuit pattern having the multilayered structure described in item (ii) above can also be formed by heating the circuit pattern having the structure described in item (i) above at 600° C. to 1000° C.

The pin bonding regions and the frame-like pattern described above have a multilayered structure similar to those described in items (i) and (ii).

A method of manufacturing a circuit pattern according to the present invention will be described in detail below by taking a circuit board on which a circuit pattern having the multilayered structure described in item (i) above is formed as an example.

An alkali earth metal compound and/or rare earth element compound and a binder are added to an AlN powder to prepare a starting material, and the starting material is molded by a doctor blade method or the like to form an AlN green sheet. Examples of the alkali earth metal compqund are an oxide, a carbide, a fluoride, a carbonate, an oxalate, a nitrate, and an alkoxide of Ca, Ba, and Sr. Examples of the rare earth element compound are an oxide, a carbide, a fluoride, a carbonate, an oxalate, a nitrate, and an alkoxide of Y, La, Ce, Nd, Dy, and Pr. In particular, compounds of Y, La, and Ce can be suitably used. Subsequently, holes are formed in the green sheet by using, e.g., a drill, and a tungsten paste is filled in the holes. Thereafter, degreasing and calcining are performed to form an AlN substrate in which the tungsten viafills are filled in the holes. Subsequently, the surface of the AlN substrate is polished to adjust a surface roughness to be suitable for forming a metal oxynitride layer.

A metal oxynitride layer consisting of Al, M1, M2, O, and N is formed on the substrate by a general film formation technique such as a vacuum deposition method, a sputter-deposition method a cluster ion beam method, an ion plating or an ion implantation method. At this time, a substrate temperature, an atmosphere, a vacuum degree, and a film formation rate are adjusted as needed. Prior to formation of the metal oxynitride layer, the substrate surface is preferably cleaned well by a wet cleaning method, a reverse sputtering method, or the like. Since, however, the AlN substrate is unstable with respect to a strong acid and a strong alkali, a cleaning fluid must be carefully selected. Normally, a neutral cleaning fluid is preferably used. Subsequently, without breaking the vacuum, a bonding layer consisting of a metal represented by M1, a barrier layer consisting of a metal represented by M2, and a conductor layer consisting of Au are sequentially formed. In addition, the conductor layer may be formed on the barrier layer by wet plating. Thereafter, a resist pattern is formed on the conductor layer by photolithography, and the above four layers are sequentially etched and patterned by using the formed pattern as a mask. The conductor layer made of Au is etched with, for example, an etchant which is a mixture of KI, I2, and deionized water. The layer is etched with, for example, an etchant which is a mixture of CuSo4, HCl, ethyl alcohol, and deionized water, if the barrier layer is made of Ni. It is etched by means of, for example, ion milling if the barrier layer is made of Pt. It is etched with, for example, an etchant comprising aqua regia and acetic acid if the barrier layer is made of Pd. The bonding layer and the metal oxynitride layer are etched with, for example, an etchant which is a mixture of HF and deionized water. As a result, a circuit board in which a circuit pattern having the multilayered structure described in item (i) above is formed on the substrate is manufactured.

According to the present invention, the circuit pattern can be formed by causing parts of the bonding layer and the barrier layer to intermix with the metal oxynitride layer as the bonding layer and the barrier layer grow gradually. In this case, it does not matter if intermixing occurs between the bonding layer and the barrier layer, or if a gradient structure is formed between these layers. Further, up to 50 wt% of the M2 component may diffuse into the bonding layer.

In the case of the circuit pattern comprised of the undercoating layer and the main layer, the upper most layer can be wet-plated with Au, or wet-plated first with Ni and then with Au. In addition, the conductor layer can be made of Cu, and a thin Au layer can be formed on the conductor layer.

Further, in the circuit board according to the present invention, not only the bonding layer, the barrier layer, and the conductor layer are formed in the order named, but also a thin film resistor and a thin film capacitor may be additionally formed.

Figure 2:
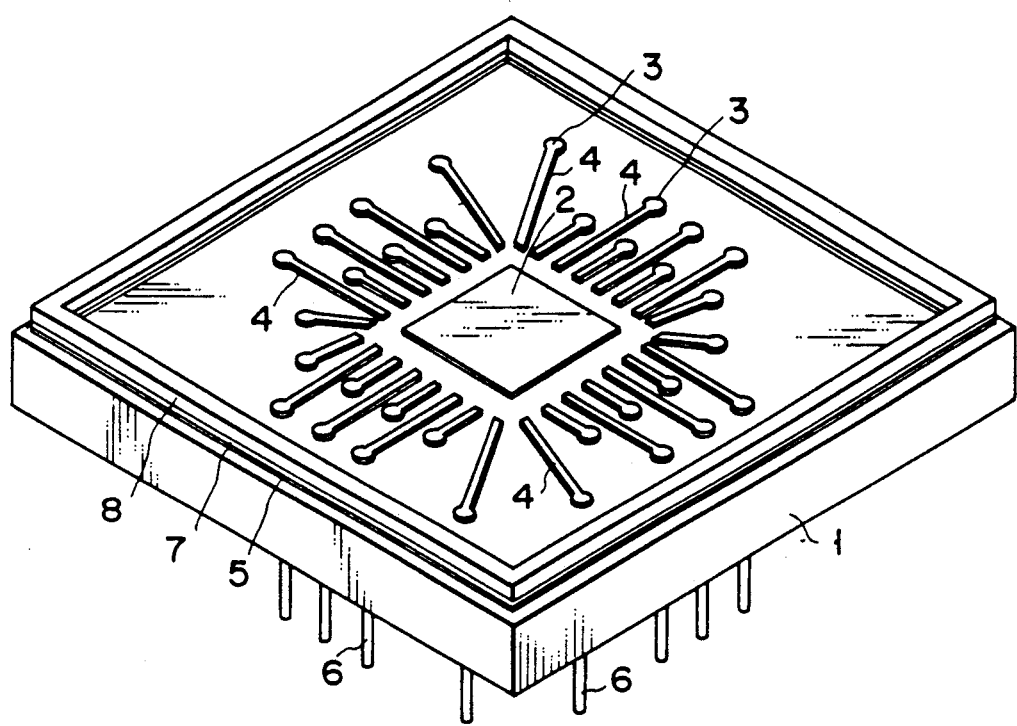
FIG. 2 a perspective view showing another circuit board according to the present invention.

Another circuit board according to the present invention will be described below with reference to FIG. 2.

A circuit pattern 2 serving as an island portion on which a semiconductor integrated circuit chip is to be mounted is formed on the surface of an AlN substrate 1. A plurality of circuit patterns 4 each having a land portion 3 at its end are formed on the substrate 1. A plurality of via fillings (not shown) consisting of, e.g., tungsten are buried in holes formed in the substrate 1. The via fillings are connected to the land portions respectively, formed on the surface of the substrate 1. A plurality of lead bonding regions, e.g., pin bonding regions (not shown) are formed on the lower surface of the substrate 1. The pin bonding regions are connected to the via fillings, respectively. A frame-like pattern 5 for bonding a seal frame is formed on the periphery of the surface of the substrate 1. Brazing material layers (not shown) are bonded on the pin bonding regions, respectively. Leads, e.g., pins 6 are bonded to the brazing material layers respectively. A frame-like brazing material layer 7 is bonded to the frame-like pattern 5. A seal frame 8 is bonded to the brazing material layer 7.

The circuit pattern 2 and the circuit patterns 4 each having the land portion 3 at its end are constituted to have, e.g., the multilayered structure described in item (i) or (ii) above.

The pin bonding regions and the frame-like pattern 5, and the brazing material layers have the following arrangement.

(a) The pin bonding regions and the frame-like pattern have a multilayered structure in which an undercoating layer represented by formula $Al_u m1_v M2_w Cu_x O_y N_z$ (wherein M1 represents a metal selected from the group consisting of Ti, Cr, Ta, and Zr, M2 represents a metal selected from the group consisting of Ni, Pt, Pd, W, Nb, and Mo, u represents 0.1 to 25 atm%, v represents 0.2 to 35 atm%, w represents 0.1 to 50 atm%, x represents 0.005 to 1.5 atm%, y represents 0 to 1.5 atm%, and z represents 0.5 to 40 atm%) and a main layer represented by formula $M1_x M2_y Cu_z$ (wherein M1 represents a metal selected from the group consisting of Ti, Cr, Ta, and Zr, M2 represents a metal selected from the group consisting of Ni, Pt, Pd, W, Nb, and Mo, X represents 1 to 50 atm%, y represents 10 to 80 atm%, and z represents 0.2 to 40 atm%) are stacked on the AlN substrate in the order named.

The undercoating layer is used to increase a bonding strength of the main layer with respect to the AlN substrate. The undercoating layer is also used to prevent the main layer from being peeled from the undercoating layer during a thermal cycle. In addition, the undercoating layer is used to relax a thermal expansion difference between the AlN substrate and the pins or the seal frame. More specifically, Al as a component of the undercoating layer has an effect of increasing the bonding strength of the main layer with respect to the AlN substrate. M1 and M2 have an effect of increasing the bonding strength of the main layer with respect to the AlN substrate and also have an effect of relaxing the thermal expansion difference between the AlN substrate and the pins or the seal frame. Cu has an effect of forming a compound with metals represented by M1 and M2 to further increase the bonding strength of the main layer with respect to the AlN substrate. O and N as other components of the undercoating layer have an effect of relaxing the thermal expansion difference between the AlN substrate and the pins or the seal frame. The ratio (atm%) of each component of the undercoating layer is limited for the following reasons.

(1) If the ratio (u) of Al is less than 0.1 atm%, the bonding strength of the main layer with respect to the AlN substrate cannot be satisfactorily increased. If the ratio of Al is more than 25 atm%, an Al amount in the undercoating layer is increased to increase the thermal expansion difference with respect to the pins or the seal frame, thereby decreasing the bonding strength of the pins or the seal frame during a thermal cycle. More preferably, the ratio of Al is 0.2 to 25 atm%.

(2) If the ratio (v) of M1 is less than 0.2 atm%, the bonding strength of the main layer with respect to the AlN substrate cannot be satisfactorily increased. If the ratio of M1 is more than 35 atm, an M1 amount in the undercoating layer is increased to increase the thermal expansion difference with respect to the pins or the seal frame, thereby decreasing the bonding strength of the pins or the seal frame during a thermal cycle. More preferably, the ratio of M1 is 0.3 to 25 atm%. In addition, Ti is most preferably selected as M1.

(3) If the ratio (w) of M2 is less than 0.1 atm%, the bonding strength of the main layer with respect to the AlN substrate cannot be satisfactorily increased. If the ratio of M2 is more than 50 atm%, an M2 amount in the undercoating layer is increased to increase the thermal expansion difference with respect to the pins or the seal frame, thereby decreasing the bonding strength of the pins or the seal frame during a thermal cycle. More preferably, the ratio of M2 is 0.1 to 45 atm%. In addition, Ni is most preferably selected as M2.

(4) If the ratio (x) of Cu is less than 0.005 atm%, a production amount of the compound with metals represented by M1 and M2 is decreased to make it difficult to satisfactorily increase the bonding strength between the AlN substrate and the main layer. If the ratio of Cu is more than 1.5 atm%, a production amount of an intermetallic compound which degrades bonding properties is increased to degrade the bonding strength between the AlN substrate and the main layer. In addition, the thermal expansion difference with respect to the pins or the seal frame is increased to decrease the bonding strength of the pins or the seal frame during a thermal cycle. More preferably, the ratio of Cu is 0.005 to 1.2 atm%.

(5) When O is used as a component of the undercoating layer, its ratio (y) is set to be 0.0001 to 1.5 atm%. The ratio of O is limited for the following reason. That is, if the ratio of O is less than 0.0001 atm%, the thermal expansion difference with respect to the pins or the seal frame is suppressed to make it difficult to increase the bonding strength of the pins or the seal frame during a thermal cycle. If the ratio of O is more than 1.5 atm%, the thermal expansion difference with respect to the pins or the seal frame is increased to decrease the bonding strength of the pins or the seal frame during a thermal cycle. More preferably, the ratio of O is 0.0001 to 1.2 atm%.

(6) If the ratio (z) of N is less than 0.5 atm%, the thermal expansion difference with respect to the pins or the seal frame is suppressed to make it difficult to increase the bonding strength of the lead pins or the seal frame. If the ratio of N is more than 40 atm%, the thermal expansion difference with respect to the pins or the seal frame is increased to decrease the bonding strength of the pins or the seal frame during a thermal cycle. More preferably, the ratio of N is 0.7 to 3.5 atm%.

The thickness of the undercoating layer is preferably 3 nm or more for the following reason. That is, if the thickness of the undercoating layer is less than 3 nm, it is difficult to stably increase the bonding strength with respect to the AlN substrate and the main layer. The upper limit of the thickness of the undercoating layer is preferably 500 nm, for the purpose of suppressing the side-etching during the patterning of the undercoating layer, and also rendering the circuit board thinner. More preferably, the thickness of the undercoating layer is 5 to 500 nm.

The main layer is used to increase a bonding strength of the brazing material layer with respect to the undercoating layer. More specifically, M1 as a component of the main layer has an effect of suppressing a thermal expansion difference with respect to the pins or the seal frame to increase a bonding strength of the pins or the seal frame. M2 and Cu have an effect of increasing a bonding strength of the bonding layer with respect to the undercoating layer. The ratio (atm%) of each component of the main layer is limited for the following reason.

(1) If the ratio (x) of M1 is less than 1 atm%, the thermal expansion difference with respect to the pins or the seal frame is suppressed to make if difficult to increase the bonding strength of the pins or the seal frame. If the ratio of M1 is more than 50 atm%, an amount of a compound produced by a reaction with M2 and Cu is increased to decrease the bonding strength of the pins or the seal frame during a thermal cycle. More preferably, the ratio of M1 is 3 to 40 atm%. In addition, Ti is most preferably selected as M1.

(2) If the ratio (y) of M2 is less than 10 atm%, bonding properties of the brazing material layer with respect to the undercoating layer are degraded. If the ratio of M2 is more than 80 atm%, bonding properties with respect to the undercoating layer and the brazing material layer are degraded. More preferably,, the ratio of M2 is 20 to 80 atm%. In addition, Ni is most preferably selected as M2.

(3) If the ratio (z) of Cu is less than 0.2 atm%, the bonding strength of the brazing material layer with respect to the undercoating layer is decreased. If the ratio of Cu is more than 40 atm%, an amount of a compound produced by a reaction with M1 and M2 is increased to decrease the bonding strength with respect to the pins or the seal frame during a thermal cycle. More preferably, the ratio of Cu is 0.2 to 30 atm%.

The thickness of the main layer is preferably 10 to 500 nm. This is because, if the main layer is less than 10 nm thick, it can hardly be bonded firmly to the under coating layer, though the difference in thermal expansion between it and the pins or the seal frame. Conversely, if the main layer is more than 500 nm thick, its bonding strength with respect to the pins or the seal frame will decrease during the heat cycle.

(b) The brazing material layer consists of a composition bonded to the main layer of the pin bonding regions or the flame-like pattern and represented by formula $Ag_xCu_yAu_z$ (wherein x represents 5 to 90 atm%, y represents 1 to 50 atm%, and represents 1 to 50 atm%).

The brazing material layer is used to increase a bonding strength of the pins or the seal frame with respect to the main layer. The ratio (atm%) of each component of the brazing material layer is limited for the following reason.

(1) If the ratio (x) of Ag is either less than 5 atm% or more than 90 atm%, a temperature for bonding the brazing material to the pin bonding regions or the like is increased to increase thermal expansion coefficients of the AlN substrate and the brazing material layer upon bonding, thereby decreasing the bonding strength of the pins or the seal frame. More preferably, the ratio of Ag. is 10 to 90 atm%.

(2) If the ratio (y) of Cu is either less than 1 atm% or more than 50 atm%, the temperature for bonding the brazing material to the pin bonding regions or the like is increased to increase the thermal expansion coefficients of the AlN substrate and the brazing material layer upon bonding, thereby decreasing the bonding strength of the pins or the seal frame. More preferably, the ratio of Cu is 3 to 40 atm%.

(3) If the ratio (z) of Au is less than 1 atm%, wettability with respect to the main layer such as the pin bonding regions or the flame-like pattern is decreased to locally concentrate the brazing material. As a result, the thermal expansion coefficients of the AlN substrate and the brazing material layer are increased to decrease the bonding strength of the pins or the seal frame. If the ratio of Au is more than 50 atm%, the temperature for bonding the brazing material to the pin bonding regions or the flame-like pattern is increased to increase not only the thermal expansion coefficients of the AlN substrate and the brazing material layer upon bonding but also hardnesses of these members, thereby decreasing the bonding strength of the pins or the seal frame. More preferably, the ratio of Au is 25 to 45 atm%.

The thickness of the brazing material layer is preferably 1 to 100 μm. This is because, if the brazing material layer is less than 1 μm thick, its bonding strength with respect to the pins or the seal frame will likely decrease. Conversely, if the brazing material layer is more than 100 μm thick, the AlN substrate will have micro-cracks due to the difference in thermal expansion between the brazing material layer and the AlN substrate, possibly impairing the strength of the bonding between the AlN substrate on the one hand, and the pins or the seal frame on the other hand.

The pin bonding regions and the frame-like pattern having the arrangement as described in item (a) above and the brazing material layer having the arrangement as described in item (b) above can also be formed by the following process. This process will be described below by taking the pin bonding regions as an example. That is, pin bonding regions having the multilayered structure as described in item (i) or (ii) above are formed, an Ag-Cu-based brazing material layer is arranged at the pin bonding regions, and pins are arranged on the brazing material layer and bonded thereto by heating at a temperature of 780° C. to 1000° C. In this bonding with heat, the layers of the multilayered structure of item (i) or (ii) and the Ag-Cu-based brazing material layer are mutually diffused to form the pin bonding regions having the arrangement described in item (a) above and the brazing material layer having the arrangement described in item (b) above.

The pins 6 and the seal frame 8 may consist of, e.g., an Ni-Fe-Cu alloy-based Kovar or a 42% Ni-Fe alloy.

A circuit board according to the present invention has a circuit pattern having a multilayered structure in which a metal oxynitride layer represented by formula $Al_uM1_vM2_xO_yN_z$ (wherein M1 represents a metal selected from the group consisting of Ti, Cr, Ta, and Zr, M2 represents a metal selected from the group consisting of Ni, Pt, Pd, W, Nb, and Mo, u represents 3 to 50 atm%, v represents 3 to 78 atm%, x represents 0 to 50 atm%, y represents 0.005 to 25 atm%, and z represents 5 to 70 atm%), a bonding layer consisting of a metal represented by M1, a barrier layer consisting of a metal represented by M2, and a conductor layer consisting of Au are stacked in the order named.

In the above arrangement, since the AlN substrate has a high thermal conductivity, it can efficiently radiate heat generated by an active element mounted on the circuit pattern, e.g., an IC chip or an LSI chip.

In addition, a circuit pattern having a high bonding strength with respect to the AlN substrate and free from peeling or disconnection during a thermal cycle can be formed.

That is, formation of a circuit pattern having a high bonding strength with respect to an AlN substrate generally depends on lattice constants of the circuit pattern and the AlN substrate, a difference between thermal expansion coefficients, and the presence/absence of chemical reactivity. As described above, since the metal oxynitride layer represented by the above formula contains Al, M1, O, and N as its components at predetermined atomic ratios, it can increase the bonding properties of the bonding layer with respect to the AlN substrate and can prevent the bonding layer from being peeled from the metal oxynitride layer. In addition, when the metal oxynitride layer contains M2 at a predetermined atomic ratio, since M2 has a high reactivity with Al, M1, O, and N and also has a high reactivity with the components of the barrier layer, the bonding strength of the bonding layer with respect to the AlN substrate can be further increased. The bonding layer can increase the bonding strength of the barrier layer with respect to the metal oxynitride layer. The barrier layer has an effect of preventing mutual diffusion of the bonding layer and the Au conductor layer which respectively underlies and overlies the barrier layer. The conductor layer serves as a conductor portion for decreasing a resistance of the circuit pattern. Therefore, a good circuit pattern which has a high bonding strength with respect to the AlN substrate and in which peeling and disconnection of each layer during a thermal cycle can be prevented can be formed.

The circuit board as described above has a circuit pattern having high heat radiation properties and a high bonding strength with respect to the AlN substrate and therefore can be effectively used as a semiconductor package or a semiconductor module which can mount active elements such as IC chips or LSI chips at a high packing density.

Another circuit board according to the present invention has a circuit board having a multilayered structure in which an undercoating layer represented by formula $Al_uM1_vM2_wAu_xO_yN_z$ (wherein M1 is a metal selected from the group consisting of Ti, Cr, Ta, and Zr, M2 represents a metal selected from the group consisting of Ni, Pt, Pd, W, Nb, and Mo, u represents 0.1 to 40 atm%, v represents 0.5 to 50 atm%, w represents 0.1 to 50 atm%, x represents 0.05 to 30 atm%, y represents 0 to 20 atm%, and z represents 0.1 to 40 atm%) and a main layer represented by formula $M1_wM2_xAu_yO_z$ (wherein M1 represents a metal selected from the group consisting of Ti, Cr, Ta, and Zr, M2 represents a metal selected from the group consisting of Ni, Pt, Pd, W, Nb, and Mo, w represents 0.5 to 50 atm%, x represents 0.1 to 50 atm%, y represents 0.1 to 80 atm%, and z represents 0 to 1.5 atm%) are stacked on an AlN substrate in the order named.

In the above arrangement, since the AlN substrate has a high thermal conductivity, it can efficiently radiate heat generated by an active element mounted on the circuit pattern such as an IC ship or an LSI chip.

In addition, a good circuit pattern having a high bonding strength with respect to the AlN substrate and free from peeling or disconnection during a thermal cycle can be formed.

That is, as described in item (ii) above, since the undercoating layer represented by the above formula contains Al, M1, M2, and N as its components at predetermined atomic ratios, it can increase the bonding properties of the main layer with respect to the AlN substrate and can prevent the main layer from being peeled from the undercoating layer during a thermal cycle. In addition, when the undercoating layer contains especially O at a predetermined atomic ratio, matching of lattice constants and relaxation of a thermal expansion difference between the AlN substrate and the main layer which respectively underlies and overlies the undercoating layer can be further improved. As described in item (ii) above, since the main layer represented by the above formula contains M1, M2, and Au as its components at predetermined atomic ratios, it can increase its bonding strength with respect to the undercoating layer and has a low resistance. When the main layer contains especially O at a predetermined atomic ratio, the bonding strength with respect to the undercoating layer can be further increased. Therefore, a circuit pattern which has a high bonding strength with respect to the AlN substrate and in which each layer can be prevented from being peeled or disconnected during a thermal cycle can be formed.

The above circuit board has a circuit pattern having good heat radiation properties and a high bonding strength with respect to the AlN substrate and therefor can be effectively used as a semiconductor package or a semiconductor module which can mount active elements such as IC chips or LSI chips at a high density.

Still another circuit board according to the present invention comprises pin bonding regions having a multilayered structure in which an undercoating layer represented by formula $Al_uM1_vM2_wCu_xO_yN_z$ (wherein M1 represents a metal selected from the group consisting of Ti, Cr, Ta, and Zr, M2 represents a metal selected from the group consisting of Ni, Pt, Pd, W, Nb, and Mo, u represents 0.1 to 25 atm%, v 0.2 to 35 atm%, w represents 0.1 to 50 atm%, x represents 0.005 to 1.5 atm%, y represents 0 to 1.5 atm%, and z represents 0.5 to 40 atm%) and a main layer represented by formula $M1_xM2_yCu_z$ (wherein M1 represents a metal selected from the group consisting of Ti, Cr, Ta, and Zr, M2 represents a metal selected from the group consisting of Ni, Pt, Pd, W, Nb, and Mo, x represents 1 to 50 atm%, y represents 10 to 80 atm%, and z represents 0.2 to 40 atom%) are stacked on an AlN substrate in the order named, a circuit pattern electrically connected to the pin bonding regions, a brazing material layer bonded to the main layer of the pin bonding regions and represented by formula $Ag_xCu_yAu_z$ (wherein x represents 5 to 90 atm%, y represents 1 to 50 atm%, and z represents 1 to 50 atm%), and pins connected to the brazing material layer.

In the above arrangement, since the AlN substrate has a radiate heat generated by an active element mounted on the circuit pattern such as an IC chip or an LSI chip.

In addition, the pins can be bonded to the AlN substrate with a high bonding strength, and peeling of the pins during a thermal cycle can be prevented.

That is, as described in item (a) above, since the undercoating layer which is a lower layer constituting the pin bonding regions and represented by the above formula contains Al, M1, M2, Cu, and N as its components at predetermined atomic ratios, it can increase the bonding properties of the main layer with respect to the AlN substrate. In addition, the undercoating layer can prevent the main layer from being peeled from the undercoating layer in a thermal cycle. Furthermore, a thermal expansion difference between the AlN substrate and the pins can be relaxed. When the undercoating layer contains especially O at a predetermined atomic ratio, the thermal expansion difference between the AlN substrate and the pins can be further relaxed. As described in item (a) above, since the main layer which is an upper layer constituting the pin bonding regions and represented by the above formula contains M1, M2, and Cu as its components at predetermined atomic ratios, it can increase the bonding strength of the brazing material layer with respect to the undercoating layer. As described in item (b) above, since the brazing material layer represented by the above formula contains Ag, Cu, and Au as its components at predetermined atomic ratios, it can increase the bonding strength of the pins with respect to the AlN substrate and can prevent peeling of the pins during a thermal cycle.

The above circuit board has good heat radiation properties and a high bonding strength with respect to the AlN substrate and therefore can be effectively used as a semiconductor package or a semiconductor module which can mount active elements such as IC chips or LSI chips at a high density.

In addition, in the circuit board to which the pins are bonded, by stacking a frame-like pattern having a multi-layered structure in which an undercoating layer represented by the above formula $Al_uM1_vM2_wCu_xO_yN_z$ (wherein M1 represents a metal selected from the group consisting of Ti, Cr, Ta, and Zr, M2 represents a metal selected from the group consisting of Ni, Pt, Pd, W, Nb, and Mo, u represents 0.1 to 25 atm%, v 0.2 to 35 atm%, w represents 0.1 to 50 atm%, x represents 0.005 to 1.5 atm%, y represents 0 to 1.5 atm%, and z represents 0.5 to 40 atm%) and a main layer represented by the above formula $M1_xM2_yCu_z$ (wherein M1 represents a metal selected from the group consisting of Ti, Cr, Ta, and Zr, M2 represents a metal selected from the group consisting of Ni, Pt, Pd, W, Nb, and Mo, x represents 1 to 50 atm%, y represents 10 to 80 atm%, and z represents 0.2 to 40 atm%) on an AlN substrate in the order named, bonding a brazing material layer represented by the above formula $Ag_xCu_yAu_z$ (wherein x represents 5 to 90 atm%, y represents 1 to 50 atm%, and z represents 1 to 50 atm%) on the main layer of the flame-like pattern, and bonding a seal frame to the brazing material layer, the seal frame can be bonded to the AlN substrate with a high bonding strength, and peeling of the seal frame during a thermal cycle can be prevented. This circuit board has the pins and the seal frame having good heat radiation properties and a high bonding strength with respect to the AlN substrate and therefore can be effectively used as a semiconductor package or a semiconductor module which can mount active elements such as IC chips or LSI chips at a high packing density and can air-tightly seal the mounted active elements.

DETAILED DESCRIPTION OF THE PREFERRED EMBODIMENTS

The present invention will be described in detail below by way of its examples.

EXAMPLES 1-5

1 wt% of a CaO powder and 3 wt% of a $Y_2O_3$ powder were added to an AlN powder having an oxygen content of 0.03 atm% and an average grain size of 15/μm, polymethylmethacrylate was added to the resultant mixture, and the resultant mixture was kneaded in the presence of water, thereby preparing a starting material. Subsequently, the starting material was molded by a doctor blade method to form a green sheet. Holes were formed at predetermined portions of the green sheet by using a drill, and a tungsten paste was filled in the holes. Thereafter, the green sheet was degreased and calcined in a nitrogen atmosphere, thereby manufacturing an AlN substrate having via fillings consisting of W and a thermal conductivity of 280 W/m.K.

Lapping and polishing were performed such that an average linear surface roughness of the AlN substrate was 150 nm, and wet cleaning and reverse sputtering were performed on the substrate surface. 100-nm thick metal oxynitride layers were formed on the two surfaces of the substrate under the conditions listed in Table to be presented later by using a sputter-deposition apparatus. Subsequently, without breaking the vacuum of the sputter-deposition apparatus, a 50-nm thick Ti bonding layer, a 500-nm thick barrier layer, and a 1-μm thick Au conductor layer were sequentially formed on the metal oxynitride layer. Note that Ni was used as the barrier layer in Examples 1, 4, and 5, Pt was used as the barrier layer in Example 2, and Pd was used as the barrier layer in Example 3.

A resist pattern was formed by photolithography on the conductor layer formed on the upper surface side of the substrate, and the conductor layer, the barrier layer, the bonding layer, and the metal oxynitride layer were sequentially selectively removed by etching by using the resist pattern as a mask, thereby forming a circuit pattern, a circuit pattern having a land portion at its end, and a frame-like pattern. In addition, after a resist pattern was formed by photolithography on the conductor layer formed on the lower surface side of the substrate, etching was similarly performed to form pin bonding regions. By performing these manufacturing steps, five types of circuit boards having the structure shown in FIG. 1 were manufactured.

COMPARATIVE EXAMPLES 1 & 2

Two types of circuit boards having the arrangement shown in FIG. 1 were manufactured following the same procedures as in Example 1 except that a metal oxynitride layer was formed under the conditions listed in Table 1 to be presented later on the surface of an AlN substrate having a thermal conductivity and subjected to a surface treatment as described in Example 1.

A bonding strength of a circuit pattern and its state obtained after a TCT (Temperature Cycle Test) were checked for each circuit board of Examples 1 to 5 and Comparative Examples 1 and 2. The results are summarized in Table 1. Note that the bonding strength and the characteristics (strength characteristics and peeling characteristics) after the TCT were evaluated by the following method.

(i) Bonding Strength

An Sn-plated copper wire having a diameter of 0.7 mm was bonded on a circuit pattern by using an Sn-Pb-based solder. Subsequently, the copper wire was stretched at a rate of 5 cm/min. by using a tensile strength tester (#4301 available from Instron Co.), thereby evaluating the bonding strength of the circuit pattern.

(ii) Strength Characteristics After TCT

After the circuit board was cooled to −50° C., it was heated up to 150° C. and held at this temperature for 30 minutes, and this temperature cycle was repeatedly performed 1,000 times. Thereafter, the bonding strength of a circuit pattern of this circuit board was measured following the same procedures as in item (i) above. In this case, if the bonding strength as obtained before the TCT was obtained, "strength not decreased" was determined. If the bonding strength was decreased as compared with that obtained before the TCT, "strength decreased" was determined.

(iii) Peeling Characteristics After TCT

A mending tape (scotch 810 available from 3M Co.) was adhered on a circuit pattern of a circuit board subjected to the TCT, and a peeling test was conducted by pulling the tape with a sufficient strength. Thereafter, the adhesion surface of the tape and the surface of the circuit pattern were observed by an electron microscope. At this time, if a peeled piece of the circuit pattern was adhered on the tape surface or a peeled mark was formed on the circuit pattern, "peeled" was evaluated. If no peeled piece nor mark was found, "not peeled" was evaluated.

As is apparent from Table 1 to be presented later, each of the circuit patterns of Examples 1 to 5 having a metal oxynitride layer represented by formula $Al_uTi_vO_yN_z$ (wherein u represents 3 to 50 atm%, v represents 3 to 78 atm%, y represents 0.005 to 25 atm%, and z represents 5 to 70 atm%) has a high bonding strength with respect to the AlN substrate and causes no decrease in bonding strength nor peeling in the evaluation performed after 1,000 cycles of the TCT, i.e., has good bonding properties. To the contrary, the circuit pattern of Comparative Examples 1 having 0 atm% of an O amount as a component of the metal oxynitride layer has a low bonding strength with respect t the AlN substrate and causes peeling of the circuit pattern in the evaluation performed after 1,000 cycles of the TCT. The circuit pattern of Comparative Examples 2 having less than 3 atm% of a Ti amount as a component of the metal oxynitride layer has a low bonding strength with respect to the AlN substrate and causes peeling of the circuit pattern in the evaluation performed after 1,000 cycles of the TCT.

The circuit boards of Examples 1 to 5 were subjected to a heat-resistance test, wherein they were left to stand at 500° C. for 5 minutes. They were also subjected to PCT test, wherein they were left to stand at 121° C. under 2 atm for 2,000 hours. The circuit boards, thus tested, were found to have their circuit patterns intact.

EXAMPLES 6–9

Following the same procedures as in Example 1, lapping, polishing, wet cleaning, and reverse sputtering were sequentially performed for the surface of an AlN substrate having an oxygen content and a thermal conductivity listed in Table 2 to be presented later and having via fillings consisting of W. Metal oxynitride layers were formed on the two surfaces of the substrate under the conditions listed in Table 2 by using a sputter-deposition apparatus. Subsequently, without breaking the vacuum of the sputter-deposition apparatus, a bonding layer, a barrier layer, and a conductor layer were sequentially formed on the metal oxynitride layer under the conditions as listed in Table 2.

Thereafter, following the same procedures as in Example 1, the layers formed on the upper surface side of the substrate were selectively etched to form a circuit pattern, a circuit pattern having a land portion at its end, and a frame-like pattern. In addition, following the same procedures as in Example 1, the layers formed on the lower surface side of the substrate were selectively etched to form pin bonding regions. By performing these manufacturing steps, four types of circuit boards having the structure shown in FIG. 1 were manufactured.

Following the same procedures as in Example 1, a bonding strength of a circuit pattern and its characteristics (strength characteristics and peeling characteristics) obtained after the TCT was performed were checked for each of the circuit boards of Examples 6 to 9. The results are summarized in Table 2.

EXAMPLES 10 & 11

Following the same procedures as in Example 1, lapping, polishing, wet cleaning, and reverse sputtering were sequentially performed for the surface of an AlN substrate having an oxygen content and a thermal conductivity listed in Table 3 to be presented later and having via fillings consisting of W. Metal oxynitride layers were formed on the two surfaces of the substrate under the conditions listed in Table 3 by using a sputter-deposition apparatus. Subsequently, without breaking the vacuum of the sputter-deposition apparatus, a bonding layer, a barrier layer, and a conductor layer were sequentially formed on the metal oxynitride layer under the conditions as listed in Table 3.

Thereafter, following the same procedures as in Example 1, the layers formed on the upper surface side of the substrate were selectively etched to form a circuit pattern, a circuit pattern having a land portion at its end, and a frame-like pattern. In addition, following the same procedures as in Example 1, the layers formed on the lower surface side of the substrate were selectively etched to form pin bonding regions. By performing these manufacturing steps, two types of circuit boards having the structure shown in FIG. 1 were manufactured.

COMPARATIVE EXAMPLES 3–5

Following the same procedures as in Example 1, lapping, polishing, wet cleaning, and reverse sputtering were sequentially performed for the surface of an AlN substrate having an oxygen content and a thermal conductivity listed in Table 3 to be presented later and having viafills consisting of W. Metal oxynitride layers were formed on the two surfaces of the substrate under the conditions listed in Table 3 by using a sputter-deposition apparatus. Subsequently, without breaking the vacuum of the sputter-deposition apparatus, a bonding layer, a barrier layer, and a conductor layer were sequentially formed on the metal oxynitride layer under the conditions as listed in Table 3.

Thereafter, following the same procedures as in Example 1, the layers formed on the upper surface side of the substrate were selectively etched to form a circuit pattern, a circuit pattern having a land portion at its end, and a frame-like pattern. In addition, following the same procedures as in Example 1, the layers formed on the lower surface side of the substrate were selectively etched to form pin bonding regions. By performing these manufacturing steps, three types of circuit boards having the structure shown in FIG. 1 were manufactured.

Following the same procedures as in Example 1, a bonding strength of a circuit pattern and its characteristics (strength characteristics and peeling characteristics) obtained after the TCT was performed were checked for each of the circuit boards of Examples 10 and 11 and Comparative Examples 3 to 5. The results are summarized in Table 3.

As is apparent from Tables 2 and 3 to be presented later, each of the circuit patterns of Examples 6 to 11 having a metal oxynitride layer represented by formula $Al_uTi_vNi_xO_yN_z$ (wherein u represents 3 to 50 atm%, v represents 3 to 78 atm%, x represents 0.0001 to 50 atm%, y represents 0.005 to 25 atm%, and z represents 5 to 70 atm%) has a high bonding strength with respect to the AlN substrate and causes no decrease in bonding strength nor peeling in the evaluation performed after 1,000 cycles of the TCT, i.e., has good bonding properties. To the contrary, the circuit pattern of Comparative Example 3 having 0 atm% of an Al amount as a component of the metal oxynitride layer has a low bonding strength with respect to the AlN substrate and causes peeling of the circuit pattern in the evaluation performed after 1,000 cycles of the TCT. The circuit pattern of Comparative Example 4 having less than 3 atm% of a Ti amount as a component of the metal oxynitride layer has a low bonding strength with respect to the AlN substrate and causes peeling of the circuit pattern in the evaluation performed after 1,000 cycles of the TCT. In addition, the circuit pattern of Comparative Example 5 having 0 atm% of an N amount as a component of the metal oxynitride layer has a low bonding strength with respect to the AlN substrate and causes peeling of the circuit pattern in the evaluation performed after 1,000 cycles of the TCT.

The circuit boards of Examples 6 to 11 were subjected to a heat-resistance test, wherein they were left to stand at 500° C. for 5 minutes. They were also subjected to PCT test, wherein they were left to stand at 121° C. under 2 atm for 2,000 hours. The circuit boards, thus tested, were found to have their circuit patterns intact.

EXAMPLES 12 & 13

Following the same procedures as in Example 1, lapping, polishing, wet cleaning, and reverse sputtering were sequentially performed for the surface of an AlN substrate having an oxygen content and a thermal conductivity listed in Table 4 to be presented later and having viafills consisting of W. Metal oxynitride layers were formed on the two surfaces of the substrate under the conditions listed in Table 4 by using a sputter-deposition apparatus. Subsequently, without breaking the vacuum of the sputter-deposition apparatus, a bonding layer, a barrier layer, and a conductor layer were sequentially formed on the metal oxynitride layer under the conditions as listed in Table 4.

Thereafter, following the same procedures as in Example 1, the layers formed on the upper surface side of the substrate were selectively etched to form a circuit pattern, a circuit pattern having a land portion at its end, and a frame-like pattern. In addition, following the same procedures as in Example 1, the layers formed on the lower surface side of the substrate were selectively etched to form pin bonding regions. By performing these manufacturing steps, two types of circuit boards having the structure shown in FIG. 1 were manufactured.

COMPARATIVES EXAMPLES 6 & 7

Following the same procedures as in Example 1, lapping, polishing, wet cleaning, and reverse sputtering were sequentially performed for the surface of an AlN substrate having an oxygen content and a thermal conductivity listed in Table 4 to be presented later and having viafills consisting of W. Metal oxynitride layers were formed on the two surfaces of the substrate under the conditions listed in Table 4 by using a sputter-deposition apparatus. Subsequently, without breaking the vacuum of the sputter-deposition apparatus, a bonding layer, a barrier layer, and a conductor layer were sequentially formed on the metal oxynitride layer under the conditions as listed in Table 4.

Thereafter, following the same procedures as in Example 1, the layers formed on the upper surface side of the substrate were selectively etched to form a circuit pattern, a circuit pattern having a land portion at its end, and a frame-like pattern. In addition, following the same procedures as in Example 1, the layers formed on the lower surface side of the substrate were selectively etched to form pin bonding regions. By performing these manufacturing steps, two types of circuit boards having the structure shown in FIG. 1 were manufactured.

Following the same procedures as in Example 1, a bonding strength of a circuit pattern and its characteristics characteristics (strength characteristics and peeling characteristics) obtained after the TCT was performed were checked for each of the circuit boards of Examples 12 and 13 and Comparative Examples 6 and 7. The results are summarized in Table 4.

As is apparent from Table 4 to be presented later, each of the circuit patterns of Examples 12 and 13 having a metal oxynitride layer represented by formula $Al_uTi_vW_xO_yN_z$ (wherein u represents 3 to 50 atm%, v represents 3 to 78 atm%, x represents 0.0001 to 50 atm%, y represents 0.005 to 25 atm%, and z represents 5 to 70 atm%) has a high bonding strength with respect to the AlN substrate and causes no decrease in bonding strength nor peeling in the evaluation performed after 1,000 cycles of the TCT, i.e., has good bonding properties. To the contrary, the circuit pattern of Comparative Example 6 having more than 70 atm% of an N amount as a component of the metal oxynitride layer has a low bonding strength with respect to the AlN substrate and causes peeling of the circuit pattern in the evaluation performed after 1,000 cycles of the TCT. The circuit pattern of Comparative Example 7 having more than 25 atm% of an O amount as a component of the metal oxynitride layer has a low bonding strength with respect to the AlN substrate and causes peeling of the circuit pattern in the evaluation performed after 1,000 cycles of the TCT.

The circuit boards of Examples 12 and 13 were subjected to a heat-resistance test, wherein they were left to stand at 500° C. for 5 minutes. They were also subjected to PCT test, wherein they were left to stand at 121° C. under 2 atm for 2,000 hours. The circuit boards, thus tested, were found to have their circuit patterns intact.

EXAMPLES 14–17

Following the same procedures as in Example 1, lapping, polishing, wet cleaning, and reverse sputtering were sequentially performed for the surface of an AlN substrate having an oxygen content and a thermal conductivity listed in Table 5 to be presented later and having viafills consisting of W. Metal oxynitride layers were formed on the two surfaces of the substrate under the conditions listed in Table 5 by using a sputter-deposition apparatus. Subsequently, without breaking the vacuum of the sputter-deposition apparatus, a bonding layer, a barrier layer, and a conductor layer were sequentially formed on the metal oxynitride layer under the conditions as listed in Table 5.

Thereafter, following the same procedures as in Example 1, the layers formed on the upper surface side of the substrate were selectively etched to form a circuit pattern, a circuit pattern having a land portion at its end, and a frame-like pattern. In addition, following the same procedures as in Example 1, the layers formed on the lower surface side of the substrate were selectively etched to form pin bonding regions. By performing these manufacturing steps, four types of circuit boards having the structure shown in FIG. 1 were manufactured.

Following the same procedures as in Example 1, a bonding strength of a circuit pattern and its characteristics (strength characteristics and peeling characteristics) obtained after the TCT was performed were checked for each of the circuit boards of Examples 14 to 17. The results are summarized in Table 5.

EXAMPLES 18–21

Following the same procedures as in Example 1, lapping, polishing, wet cleaning, and reverse sputtering were sequentially performed for the surface of an AlN substrate having an oxygen content and a thermal conductivity listed in Table 6 to be presented later and having viafills consisting of W. Metal oxynitride layers were formed on the two surfaces of the substrate under the conditions listed in Table 6 by using a sputter-deposition apparatus. Subsequently, without breaking the vacuum of the sputter-deposition apparatus, a bonding layer, a barrier layer, and a conductor layer were sequentially formed on the metal oxynitride layer under the conditions as listed in Table 6.

Thereafter, following the same procedures as in Example 1, the layers formed on the upper surface side of the substrate were selectively etched to form a circuit pattern, a circuit pattern having a land portion at its end, and a frame-like pattern. In addition, following the same procedures as in Example 1, the layers formed on the lower surface side of the substrate were selectively etched to form pin bonding regions. By performing these manufacturing steps, four types of circuit boards having the structure shown in FIG. 1 were manufactured.

Following the same procedures as in Example 1, a bonding strength of a circuit pattern and its characteristics state (strength characteristics and peeling characteristics) obtained after the TCT was performed were checked for of the circuit boards of Examples 18 to 21. The results are summarized in Table 6.

As is apparent from Tables 5 and 6 to be presented later, each of the circuit patterns of Examples 14 to 21 having a metal oxynitride layer represented by formula $Al_u m1_v M2_x O_y N_z$ (wherein M1 represents a metal selected from the group consisting of Ti, Cr, Zr, and Ta, M2 represents a metal selected from the group consisting of Mo, Ni, Nb, and W, u represents 3 to 50 atm%, v represents 3 to 78 atm%, x represents 0.0001 to 50 atm%, y represents b 0.005 to 25 atm%, and z represents 5 to 70 atm%) has a high bonding strength with respect to the AlN substrate and causes no decrease in bonding strength nor peeling in the evaluation performed after 1,000 cycles of the TCT, i.e., has good bonding properties.

The circuit boards of Examples 14 to 21 were subjected to a heat-resistance test, wherein they were left to stand at 500° C. for 5 minutes. They were also subjected to PCT test, wherein they were left to stand at 121° C. under 2 atm for 2,000 hours. The circuit boards, thus tested, were found to have their circuit patterns intact.

EXAMPLES 22 & 23

Following the same procedures as in Example 1, lapping, polishing, wet cleaning, and reverse sputtering were sequentially performed for the surface of an AlN substrate having an oxygen content of 0.03 atm% and a thermal conductivity of 270 W/m.K and having viafills consisting of W. Undercoating layers were formed on the two surfaces of the substrate under the conditions listed in Table 7 by using a sputter-deposition apparatus. Subsequently, without breaking the vacuum of the sputter-deposition apparatus, a main layer was formed on the undercoating layer under the conditions as listed in Table 7.

After a resist pattern was formed by photolithography on the main layer formed on the upper surface side of the substrate, the main and undercoating layers were sequentially selectively removed by etching by using the resist pattern as a mask, thereby forming a circuit pattern, a circuit pattern having a land portion at its end, and a frame-like pattern. In addition, after a resist pattern was formed by photolithography on the main layer formed on the lower surface side of the substrate, selective etching was similarly performed to form pin bonding regions. By performing these manufacturing steps, two types of circuit boards having the structure shown in FIG. 1 were manufactured.

Following the same procedures as in Example 1, a bonding strength of a circuit board and its characteristics (strength characteristics and peeling characteristics) obtained after 1,000 cycles of the TCT were checked for each of the circuit boards of Examples 22 and 23. In addition, the presence/absence of peeling of each circuit pattern before the TCT was performed was checked by a peeling test according to the method of item (iii) in Example 1. The results are listed in Table 7.

EXAMPLE 24 & 25

Following the same procedures as in Example 1, lapping, polishing, wet cleaning, and reverse sputtering were sequentially performed for the surface of an AlN substrate having an oxygen content of 0.03 atm% and a thermal conductivity of 270 W/m.K and having via fillings consisting of W. Undercoating layers were formed on the two surfaces of the substrate under the conditions listed in Table 8 by using a sputter-deposition apparatus. Subsequently, without breaking the vacuum of the sputter-deposition apparatus, a main layer was formed on the undercoating layer under the conditions as listed in Table 8.

Following the same procedures as in Example 22, the layers formed on the upper surface side of the substrate were selectively removed by etching to form a circuit pattern, a circuit pattern having a land portion at its end, and a frame-like pattern. In addition, following the same procedures as in Example 22, the layers formed on the lower surface side of the substrate were selectively etched to form pin bonding regions. By performing these manufacturing steps, two types of circuit boards having the structure shown in FIG. 1 were manufactured.

Following the same procedures as in Example 1, a bonding strength of a circuit board and its characteristics (strength characteristics and peeling characteristics) obtained after 1,000 cycles of the TCT were checked for each of the circuit boards of Examples 24 and 25. In addition, the presence/absence of peeling of each circuit pattern before the TCT was performed was checked by a peeling test according to the method of item (iii) in Example 1. The results are listed in Table 8.

EXAMPLES 26 & 27

Following the same procedures as in Example 1, lapping, polishing, wet cleaning, and reverse sputtering were sequentially performed for the surface of an AlN substrate having an oxygen content of 0.03 atm% and a thermal conductivity of 270 W/m.K and having via fillings consisting of W. Undercoating layers were formed on the two surfaces of the substrate under the conditions listed in Table 9 by using a sputter-deposition apparatus. Subsequently, without breaking the vacuum of the sputter-deposition apparatus, a main layer was formed on the undercoating layer under the conditions as listed in Table 9.

Following the same procedures as in Example 22, the layers formed on the upper surface side of the substrate were selectively removed by etching to form a circuit pattern, a circuit pattern having a land portion at its end, and a frame-like pattern. In addition, following the same procedures as in Example 22, the layers formed on the lower surface side of the substrate were selectively etched to form pin bonding regions. By performing these manufacturing steps, two types of circuit boards having the structure shown in FIG. 1 was manufactured.

Following the same procedures as in Example 1, a bonding strength of a circuit board and its characteristics (strength characteristics and peeling characteristics) obtained after 1,000 cycles of the TCT were checked for each of the circuit boards of Examples 26 and 27. In addition, the presence/absence of peeling of each circuit pattern before the TCT was performed was checked by a peeling test according to the method of item (iii) in Example 1. The results are listed in Table 9.

As is apparent from Table 7 to 9 to be presented later, each of the circuit patterns of Examples 22 to 27 having an undercoating layer represented by formula $Al_uM1_vM2_wAu_xO_yN_z$ (wherein M1 represents a metal selected from the group consisting of Ti, Cr, Ta, and Zr, M2 represents a metal selected from the group consisting of Ni, W, Nb, and Mo, u represents 0.1 to 40 atm%, v represents 0.5 to 50 atm%, w represents 0.1 to 50 atm%, x represents 0.05 to 30 atm%, y represents 0 to 20 atm%, and z represents 0.1 to 40 atm%) and a main layer represented by formula $M1_wM2_xAu_yO_z$ (wherein M1 represents a metal selected from the group consisting of Ti, Cr, Ta, and Zr, M2 represents a metal selected from the group consisting of Ni, W, Nb, and Mo, w represents 0.5 to 50 atm%, x represents 0.1 to 50 atm%, y represents 0.1 to 80 atm%, and z represents 0 to 1.5 atm%) has a high bonding strength with respect to the AlN substrate and causes no decrease in strength nor peeling in the evaluation performed after 1,000 cycles of the TCT, i.e., has good bonding characteristics.

EXAMPLES 28 & 29

Following the same procedures as in Example 1, lapping, polishing, wet cleaning, and reverse sputtering were performed on the surface of an AlN substrate having an oxygen content of 0.03,at% and a thermal conductivity of 270 W/m.K and having via fillings consisting of W. Metal oxynitride layers were formed on the two surfaces of the substrate under the conditions listed in Table 10 to be presented later by using a sputter-deposition apparatus. Subsequently, without breaking the vacuum in the sputter-deposition apparatus, a bonding layer, a barrier layer, and a conductor layer were sequentially formed on the metal oxynitride layer under the conditions listed in Table 10.

Following the same procedures as in Example 1, the layers formed on the upper surface side of the substrate were selectively removed by etching to form a circuit pattern, a circuit pattern having a land portion at its end, and a frame-like pattern. In addition, following the same procedures as in Example 1, the layers formed on the lower surface side of the substrate were selectively etched to form pin bonding regions.

Subsequently, an Ag-Cu-based brazing material layer was bonded to the headers of pins made of Kovar consisting of 53.48 wt% of Fe, 29 wt% of Ni, 17 wt% of Co, 0.2 wt% of Si, 0.3 wt% of Mn, and 0.02 wt% of C. Note that the diameter of the pin portion of each pin was 0.3 mm, and the diameter of the header was 0.6 mm. In addition, an Ag-Cu-based brazing material layer was bonded to the lower surface of a Kovar seal frame. Subsequently, the brazing material layer of each of the pins was temporarily fixed on a pin bonding region by using a jig, and the brazing material layer of the seal frame was temporarily fixed on the frame-like pattern by using a jig. Thereafter, a heat treatment was performed in a nitrogen atmosphere (oxygen concentration = 15 ppm or less) in a belt furnace at a maximum temperature of 830° C., thereby bonding each of the pins on a pin bonding region and the seal frame on the flame-like pattern. By performing these manufacturing steps, two types of circuit boards having the structure shown in FIG. 2 were manufactured.

Each of the circuit boards of Examples 28 and 29 had the constitution of the pin bonding region and the brazing material layer formed thereon, and the circuit pattern, which were as is shown in Table 10 and obtained due to an effect of the heat treatment performed in the bonding step. A bonding strength of a circuit pattern obtained before the pin bonding step was checked for each circuit board in accordance with the method of item (i) in Example 1. In addition, a pin tensile strength at the pin bonding region and characteristics (strength characteristics) obtained after the TCT at the region of each circuit board were checked. Furthermore, a bonding strength of the circuit pattern, the presence/absence of peeling obtained by a peeling test, and characteristics (strength characteristics and peeling characteristics) obtained after the TCT were checked for each circuit board. The results are summarized in Table 10. Note that the pin tensile strength at the pin bonding region, the characteristics (strength characteristics) after the TCT, and the bonding strength of the circuit pattern and its characteristics (strength characteristics and peeling characteristics) after the TCT were evaluated by the following methods.

(1-1) Pin Tensile Strength At Pin Bonding Region

A pin at a pin bonding region was pulled at a rate of 5 cm/min. by using a tensile strength tester (#4301 available from Instron Co.) to measure the pin tensile strength.

(1-2) Strength Characteristics After TCT At Pin Bonding Region

After the circuit board was cooled to −50° C., it was heated up to 150° C. and held at the temperature for 30 minutes, and this temperature cycle was repeatedly performed 1,000 times. Thereafter, a pin tensile strength at the pin bonding region of the circuit board was measured following the same procedures as in item (1-1) above. In this case, if the same tensile strength as that obtained before the TCT was obtained, "strength not decreased" was determined. If the bonding strength was decreased as compared with that obtained before the TCT, "strength decreased" was determined. If "strength decreased" was determined, the tensile strength was also listed.

(2-1) Bonding Strength Of Circuit Pattern

An Sn-plated copper wire having a diameter of 0.7 mm was bonded on a circuit pattern by using an Sn-Pb-based solder. Subsequently, the copper wire was pulled at a rate of 5 cm/min. by using a tensile strength tester (#4301 available from Instron Co.) to evaluate the bonding strength of the circuit pattern.

(2-2) Strength Characteristics After TCT of Circuit Pattern

After the circuit board was cooled to −50° C., it was heated up to 150° C. and held at the temperature for 30 minutes, and this temperature cycle was repeatedly performed 1,000 times. Thereafter, a bonding strength of a circuit of the circuit board was measured following the same procedures as in item (2-1) above. In this case, if the same tensile strength as that obtained before the TCT was obtained "strength not decreased" was determined. If the bonding strength was decreased as compared with that obtained before the TCT, "strength decreased" was determined. If "strength decreased" was determined, the bonding strength was also listed.

(2-3) Peeling Characteristics After TCT Of Circuit Pattern

A mending tape (scotch 810 available from 3M Co.) was adhered on a circuit pattern of a circuit board subjected to the TCT, and a peeling test was conducted by pulling the tape with a sufficient strength. Thereafter, the adhesion surface of the tape and the surface of the circuit pattern were observed by using an electron microscope. In this case, if a peeled piece was adhered on the tape surface or a peeled mark was formed on the circuit pattern, "peeled" was evaluated. If no peeled piece nor mark was found, "not peeled" was evaluated.

EXAMPLES 30 & 31

Following the same procedures as in Example 1, lapping, polishing, wet cleaning, and reverse sputtering were performed on the surface of an AlN substrate having an oxygen content of 0.03 at% and a thermal conductivity of 270 W/m.K and having via fillings consisting of W. Metal oxynitride layers were formed on the two surfaces of the substrate under the conditions listed in Table 11 to be presented later by using a sputter-deposition apparatus. Subsequently, without breaking the vacuum in the sputter-deposition apparatus, a bonding layer, a barrier layer, and a conductor layer were sequentially formed on the metal oxynitride layer under the conditions listed in Table 11.

Following the same procedures as in Example 1, the layers formed on the upper surface side of the substrate were selectively removed by etching to form a circuit pattern, a circuit pattern having a land portion at its end, and a frame-like pattern. In addition, following the same procedures as in Example 1, the layers formed on the lower surface side of the substrate were selectively etched to form pin bonding regions.

Subsequently, an Ag-Cu-based brazing material layer was bonded to the headers of pins similar to those used in Example 28. In addition, an Ag-Cu-based brazing material layer wa bonded to the lower surface of a Kovar seal frame. Subsequently, the brazing material layer of the each of the pins was temporarily fixed on a pin bonding region by using a jig, and the brazing material layer of the seal frame was temporarily fixed on the frame-like pattern by using a jig. Thereafter, a heat treatment was performed in a nitrogen atmosphere (oxygen concentration=15 ppm or less) in a belt furnace at a maximum temperature of 830° C., thereby bonding each of the pins on a pin bonding region and the seal frame on the frame-like pattern. By performing these manufacturing steps, two types of circuit boards having the structure shown in FIG. 2 were manufactured.

Each of the circuit boards of Examples 30 and 31 had the constitution of the pin bonding region and the brazing material layer formed thereon, and the circuit pattern, which were as is shown in Table 11 and obtained due to an effect of the heat treatment performed in the bonding step. Following the same procedures as in Example 28, a bonding strength of a circuit board obtained before the pin bonding step, a pin tensile strength of a pin bonding region, and characteristics (strength characteristics) obtained after the TCT were checked for each circuit board. In addition, a bonding strength of a circuit board of each circuit board, the presence/absence of peeling obtained by the peeling test, and characteristics (strength characteristics and peeling characteristics) obtained after the TCT were checked. The results are summarized in Table 11.

COMPARATIVE EXAMPLES 8 & 9

Following the same procedures as in Example 1, lapping, polishing, wet cleaning, and reverse sputtering were performed on the surface of an AlN substrate having an oxygen content of 0.03 at% and a thermal conductivity of 270 W/m.K and having via fillings consisting of W. Metal oxynitride layers were formed on the two surfaces of the substrate under the conditions listed in Table 12 to be presented later by using a sputter-deposition apparatus. Subsequently, without breaking the vacuum in the sputter-deposition apparatus, a bonding layer, a barrier layer, and a conductor layer were sequentially formed on the metal oxynitride layer under the conditions listed in Table 12.

Following the same procedures as in Example 1, the layers formed on the upper surface side of the substrate were selectively removed by etching to form a circuit pattern, a circuit pattern having a land portion at its end, and a frame-like pattern. In addition, following the same procedures as in Example 1, the layers formed on the lower surface side of the substrate were selectively etched to form pin bonding regions.

Subsequently, an Ag-Cu-based brazing material layer was bonded to the headers of pins similar to those that used in Example 28. In addition, an Ag-Cu-based brazing material layer was bonded to the lower surface of a Kovar seal frame. Subsequently, the brazing material layer of each of the pins was temporarily fixed on a pin bonding region by using a jig, and the brazing material layer of the seal frame was temporarily fixed on the frame-like pattern by using a jig. Thereafter, a heat treatment was performed in a nitrogen atmosphere (oxygen concentration = 15 ppm or less) in a belt furnace at a maximum temperature of 830° C., thereby bonding each of the pins on a pin bonding region and the seal frame on the flame-like pattern. By performing these manufacturing steps, two types of circuit boards having the structure shown in FIG. 2 were manufactured.

Each of the circuit boards of Comparative Examples 8 and 9 had the constitution of the pin bonding region and the brazing material layer formed thereon, and the circuit pattern, which were as is shown in Table 12 and obtained due to an effect of the heat treatment performed in the bonding step. Following the same procedures as in Example 28, a bonding strength of a circuit board obtained before the pin bonding step, a pin tensile strength of a pin bonding region, and characteristics (strength characteristics) obtained after the TCT were checked for each circuit board. In addition, a bonding strength of a circuit board of each circuit board, the presence/absence of peeling obtained by the peeling test, and characteristics (strength characteristics and peeling characteristics) obtained after the TCT were checked. The results are summarized in Table 12.

COMPARATIVE EXAMPLES 10 & 11

Following the same procedures as in Example 1, lapping, polishing, wet cleaning, and reverse sputtering were performed on the surface of an AlN substrate having an oxygen content of 0.03 at% and a thermal conductivity of 270 W/m.K and having via fillings consisting of W. Metal oxynitride layers were formed on the two surfaces of the substrate under the conditions listed in Table 13 to be presented later by using a sputter-deposition apparatus. Subsequently, without breaking the vacuum in the sputter-deposition apparatus, a bonding layer, a barrier layer, and a conductor layer were sequentially formed on the metal oxynitride layer under the conditions listed in Table 13.

Following the same procedures as in Example 1, the layers formed on the upper surface side of the substrate were selectively removed by etching to form a circuit pattern, a circuit pattern having a land portion at its end, and a frame-like pattern. In addition, following the same procedures as in Example 1, the layers formed on the lower surface side of the substrate were selectively etched to form pin bonding regions.

Subsequently, an Ag-Cu-based brazing material layer was bonded to the headers of pins similar to those used in Example 28. In addition, an Ag-Cu-based brazing material layer was bonded to the lower surface of a Kovar seal frame. Subsequently, the brazing material layer of each of the pins was temporarily fixed on a pin bonding region by using a jig, and the brazing material layer of the seal frame was temporarily fixed on the frame-like pattern by using a jig. Thereafter, a heat treatment was performed in a nitrogen atmosphere (oxygen concentration = 15 ppm or less) in a belt furnace at a maximum temperature of 830° C., thereby bonding each of the pins on a pin bonding region and the seal frame on the flame-like pattern. By performing these manufacturing steps, two types of circuit boards having the structure shown in FIG. 2 were manufactured.

Each of the circuit boards of Comparative Example 10 and 11 had the constitution of the pin bonding region and the brazing material layer formed thereon, and the circuit pattern, which were as is shown in Table 13 and obtained due to an effect of the heat treatment performed in the bonding step. Following the same procedures as in Example 28, a bonding strength of a circuit board obtained before the pin bonding step, a pin tensile strength of a pin bonding region, and characteristics (strength characteristics) obtained after the TCT were checked for each circuit board. In addition, a bonding strength of a circuit board of each circuit board, the presence/absence of peeling obtained by the peeling test, and characteristics (strength characteristics and peeling characteristics) obtained after the TCT were checked. The results are summarized in Table 13.

As is apparent from Tables 10 to 13 to be presented later, each of the circuit boards of Examples 28 to 31 in which the pins are bonded at a predetermined temperature to the pin bonding regions having a metal oxynitride layer represented by formula $Al_uM1_vO_yN_z$ (wherein M1 represents a metal selected from the group consisting of Ti, Ta, and Cr, u represents 3 to 50 atm%, v represents 3 to 78 atm%, y represents 0.005 to 25 atm%, and z represents 5 to 70 atm%) has a high bonding strength of the pin with respect to the AlN substrate and causes no decrease in the bonding strength of the pin in the evaluation performed after 1,000 cycles of the TCT, i.e., has good characteristics. In addition, each of the circuit boards of Examples 28 to 31 obtained after the circuit pattern having the metal oxynitride layer is heated at the above temperature has a high bonding strength of the circuit pattern with respect to the AlN substrate and causes no decrease in strength nor peeling in the evaluation performed after 1,000 cycles of the TCT, i.e., has good characteristics. To the contrary, each of the circuit boards of Comparative Examples 8 and 9 having an M1 (e.g., Ti) amount falling outside the above range as a component of the metal oxynitride layer or each of the circuit boards of Comparative Examples 10 and 11 having an Al amount falling outside the above range as a component of the metal oxynitride layer has a low bonding strength at the pin bonding region and a low bonding strength of the circuit pattern.

In addition, in each of the circuit boards of Examples 28 to 31, the seal frame bonded to the frame-like pattern by the brazing material layer was bonded to the AlN substrate with high strength similarly to the pin.

EXAMPLES 32 & 33

Following the same procedures as in Example 1, lapping, polishing, wet cleaning, and reverse sputtering were performed on the surface of an AlN substrate having an oxygen content of 0.03 at% and a thermal conductivity of 270 W/m.K and having via fillings consisting of W. Metal oxynitride layers were formed on the two surfaces of the substrate under the conditions listed in Table 14 to be presented later by using a sputter-deposition apparatus. Subsequently, without breaking the vacuum in the sputter-deposition apparatus, a bonding layer, a barrier layer, and a conductor layer were sequentially formed on the metal oxynitride layer under the conditions listed in Table 14.

Following the same procedures as in Example 1, the layers formed on the upper surface side of the substrate were selectively removed by etching to form a circuit pattern, a circuit pattern having a land portion at its end, and a frame-like pattern. In addition, following the same procedures as in Example 1, the layers formed on the lower surface side of the substrate were selectively etched to form pin bonding regions.

Subsequently, an Ag-Cu-based brazing material layer was bonded to the headers of pins similar to those used in Example 28. In addition, an Ag-Cu-based brazing material layer was bonded to the lower surface of a Kovar seal frame. Subsequently, the brazing material layer of each of the pins was temporarily fixed on a pin bonding region by using a jig, and the brazing material layer of the seal frame was temporarily fixed on the frame-like pattern by using a jig. Thereafter, a heat treatment was performed in a nitrogen atmosphere (oxygen concentration = 15 ppm or less) in a belt furnace at a maximum temperature of 830° C., thereby bonding each of the pins on a pin bonding region and the seal frame on the flame-like pattern. By performing these manufacturing steps, two types of circuit boards having the structure shown in FIG. 2 were manufactured.

Each of the circuit boards of Examples 32 and 33 had the constitution of the pin bonding region and the material layer formed thereon, and the circuit pattern, which were as is shown in Table 14 and obtained due to an effect of the heat treatment performed in the bonding step. Following the same procedures as in Example 28, a bonding strength of a circuit board obtained before the pin bonding step, a pin tensile strength of a pin bonding region, and characteristics (strength characteristics) obtained after the TCT were checked for each circuit board. In addition, a bonding strength of a circuit board of each circuit board, the presence/ absence of peeling obtained by the peeling test, and characteristics (strength characteristics and peeling characteristics) obtained after the TCT were checked. The results are summarized in Table 14.

EXAMPLES 34 & 35

Following the same procedures as in Example 1, lapping, polishing, wet cleaning, and reverse sputtering were performed on the surface of an AlN substrate having an oxygen content of 0.03 at% and a thermal conductivity of 270 W/m.K and having via fillings consisting of W. Metal oxynitride layers were formed on the two surfaces of the substrate under the conditions listed in Table 15 to be presented later by using a sputter-deposition apparatus. Subsequently, without breaking the vacuum in the sputter-deposition apparatus, a bonding layer, a barrier layer, and a conductor layer were sequentially formed on the metal oxynitride layer under the conditions listed in Table 15.

Following the same procedures as in Example 1, the layers formed on the upper surface side of the substrate were selectively removed by etching to form a circuit pattern, a circuit pattern having a land portion at its end, and a frame-like pattern. In addition, following the same procedures as in Example 1, the layers formed on the lower surface side of the substrate were selectively etched to form pin bonding regions.

Subsequently, an Ag-Cu-based brazing material layer was bonded to the headers of pins similar to those used in Example 28. In addition, an Ag-Cu-based brazing material layer was bonded to the lower surface of a Kovar seal frame. Subsequently, the brazing material layer of each of the pins was temporarily fixed on a pin bonding region by using a jig, and the brazing material layer of the seal frame was temporarily fixed on the frame-like pattern by using a jig. Thereafter, a heat treatment was performed in a nitrogen atmosphere (oxygen concentration = 15 ppm or less) in a belt furnace at a maximum temperature of 830° C., thereby bonding each of the pins on a pin bonding region and the seal frame on the flame-like pattern. By performing these manufacturing steps, two types of circuit boards having the structure shown in FIG. 2 were manufactured.

Each of the circuit boards of Examples 34 and 35 had the constitution of the pin bonding region and the brazing material layer formed thereon, and the circuit pattern, which were as is shown in Table 15 and obtained due to an effect of the heat treatment performed in the bonding step. Following the same procedures as in Example 28, a bonding strength of a circuit board obtained before the pin bonding step, a pin tensile strength of a pin bonding region, and characteristics (strength characteristics) obtained after the TCT were checked for each circuit board. In addition, a bonding strength of a circuit board of each circuit board, the presence/absence of peeling obtained by the peeling test, and characteristics (strength characteristics and peeling characteristics) obtained after the TCT were checked. The results are summarized in Table 15.

EXAMPLES 36 & 37

Following the same procedures as in Example 1, lapping, polishing, wet cleaning, and reverse sputtering were performed on the surface of an AlN substrate having an oxygen content of 0.03 at% and a thermal conductivity of 270 W/m.K and having via fillings consisting of W. Metal oxynitride layers were formed on the two surfaces of the substrate under the conditions listed in Table 16 to be presented later by using a sputter-deposition apparatus. Subsequently, without breaking the vacuum in the sputter-deposition apparatus, a bonding layer, a barrier layer, and a conductor layer were sequentially formed on the metal oxynitride layer under the conditions listed in Table 16.

Following the same procedures as in Example 1, the layers formed on the upper surface side of the substrate were selectively removed by etching to form a circuit pattern, a circuit pattern having a land portion at its end, and a frame-like pattern. In addition, following the same procedures as in Example 1, the layers formed on the lower surface side of the substrate were selectively etched to form pin bonding regions.

Subsequently, an Ag-Cu-based brazing material layer was bonded to the headers of pins similar to those used in Example 28. In addition, an Ag-Cu-based brazing material layer was bonded to the lower surface of a Kovar seal frame. Subsequently, the brazing material layer of each of the pins was temporarily fixed on a pin bonding region by using a jig, and the brazing material layer of the seal frame was temporarily fixed on the frame-like pattern by using a jig. Thereafter, a heat treatment was performed in a nitrogen atmosphere (oxygen concentration = 15 ppm or less) in a belt furnace at a maximum temperature of 830° C., thereby bonding each of the pins on a pin bonding region and the seal frame on the flame-like pattern. By performing these manufacturing steps two types of circuit boards having the structure shown in FIG. 2 were manufactured.

Each of the circuit boards of Examples 36 and 37 had the constitution of the pin bonding region and the brazing material layer formed thereon, and the circuit pattern, which were as is shown in Table 16 and obtained due to an effect of the heat treatment performed in the bonding step. Following the same procedures as in Example 28, a bonding strength of a circuit board obtained before the pin bonding step, a pin tensile strength of a pin bonding region, and characteristics (strength characteristics) obtained after the TCT were checked for each circuit board. In addition, a bonding strength of a circuit board of each circuit board, the presence/absence of peeling obtained by the peeling test, and characteristics (strength characteristics and peeling characteristics) obtained after the TCT were checked. The results are summarized in Table 16.

EXAMPLES 38 & 39

Following the same procedures as in Example 1, lapping, polishing, wet cleaning, and reverse sputtering were performed on the surface of an AlN substrate having an oxygen content of 0.03 at% and a thermal conductivity of 270 W/m.K and having via fillings consisting of W. Metal oxynitride layers were formed on the two surfaces of the substrate under the conditions listed in Table 17 to be presented later by using a sputter-deposition apparatus. Subsequently, without breaking the vacuum in the sputter-deposition apparatus, a bonding layer, a barrier layer, and a conductor layer were sequentially formed on the metal oxynitride layer under the conditions listed in Table 17.

Following the same procedures as in Example 1, the layers formed on the upper surface side of the substrate were selectively removed by etching to form a circuit pattern, a circuit pattern having a land portion at its end, and a frame-like pattern. In addition, following the same procedures as in Example 1, the layers formed on the lower surface side of the substrate were selectively etched to form pin bonding regions.

Subsequently, an Ag-Cu-based brazing material layer wa bonded to the headers of pins similar to those used in Example 28. In addition, an Ag-Cu-based brazing material layer was bonded to the lower surface of a Kovar seal frame. Subsequently, the brazing material layer of each of the pins was temporarily fixed on a pin bonding region by using a jig, and the brazing material layer of the seal frame was temporarily fixed on the frame-like pattern by using a jig. Thereafter, a heat treatment was performed in a nitrogen atmosphere (oxygen concentration = 15 ppm or less) in a belt furnace at a maximum temperature of 830° C., thereby bonding each of the pins on a pin bonding region and the seal frame on the flame-like pattern. By performing these manufacturing steps, two types of circuit boards having the structure shown in FIG. 2 were manufactured.

Each of the circuit boards of Examples 38 and 39 had the constitution of the pin bonding region and the brazing material layer formed thereon, and the circuit pattern, which were as is shown in Table 17 and obtained due to an effect of the heat treatment performed in the bonding step. Following the same procedures as in Example 28, a bonding strength of a circuit board obtained before the pin bonding step, a pin tensile strength of a pin bonding region, and characteristics (strength characteristics) obtained after the TCT were checked for each circuit board. In addition, a bonding strength of a circuit board of each circuit board, the presence/absence of peeling obtained by the peeling test, and characteristics (strength characteristics and peeling characteristics) obtained after the TCT were checked. The results are summarized in Table 17.

EXAMPLES 40 & 41

Following the same procedures as in Example 1, lapping, polishing, wet cleaning, and reverse sputtering were performed on the surface of an AlN substrate having an oxygen content of 0.03 at% and a thermal conductivity of 270 W/m.K and having via fillings consisting of W. Metal oxynitride layers were formed on the two surfaces of the substrate under the conditions listed in Table 18 to be presented later by using a sputter-deposition apparatus. Subsequently, without breaking the vacuum in the sputter-deposition apparatus, a bonding layer, a barrier layer, and a conductor layer were sequentially formed on the metal oxynitride layer under the conditions listed in Table 18.

Following the same procedures as in Example 1, the layers formed on the upper surface side of the substrate were selectively removed by etching to form a circuit pattern, a circuit pattern having a land portion at its end, and a frame-like pattern. In addition, following the same procedures as in Example 1, the layers formed on the lower surface side of the substrate were selectively etched to form pin bonding regions.

Subsequently, an Ag-Cu-based brazing material layer was bonded to the headers of pins similar to those used in Example 28. In addition, an Ag-Cu-based brazing material layer was bonded to the lower surface of a Kovar seal frame. Subsequently, the brazing material layer of each of the pins was temporarily fixed on a pin bonding region by using a jig, and the brazing material layer of the seal frame was temporarily fixed on the frame-like pattern by using a jig. Thereafter, a heat treatment was performed in a nitrogen atmosphere (oxygen concentration = 15 ppm or less) in a belt furnace at a maximum temperature of 830° C., thereby bonding each of the pins on a pin bonding region and the seal frame on the flame-like pattern. By performing these manufacturing steps, two types of circuit boards having the structure shown in FIG. 2 were manufactured.

Each of the circuit boards of Examples 40 and 41 had the constitution of the pin bonding region and the brazing material layer formed thereon, and the circuit pattern, which were as is shown in Table 18 and obtained due to an effect of the heat treatment performed in the bonding step. Following the same procedures as in Example 28, a bonding strength of a circuit board obtained before the pin bonding step, a pin tensile strength of a pin bonding region, and characteristics (strength characteristics) obtained after the TCT were checked for each circuit board. In addition, a bonding strength of a circuit board of each circuit board, the presence/absence of peeling obtained by the peeling test, and characteristics (strength characteristics and peeling characteristics) obtained after the TCT were checked. The results are summarized in Table 18.

EXAMPLES 42 & 43

Following the same procedures as in Example 1, lapping, polishing, wet cleaning, and reverse sputtering were performed on the surface of an AlN substrate having an oxygen content of 0.03 at% and a thermal conductivity of 270 W/m.K and having via fillings consisting of W. Metal oxynitride layers were formed on the two surfaces of the substrate under the conditions listed in Table 19 to be presented later by using a sputter-deposition apparatus. Subsequently, without breaking the vacuum in the sputter-deposition apparatus, a bonding layer, a barrier layer, and a conductor layer were sequentially formed on the metal oxynitride layer under the conditions listed in Table 19.

Following the same procedures as in Example 1, the layers formed on the upper surface side of the substrate were selectively removed by etching to form a circuit pattern, a circuit pattern having a land portion at its end, and a frame-like pattern. In addition, following the same procedures as in Example 1, the layers formed on the lower surface side of the substrate were selectively etched to form pin bonding regions.

Subsequently, an Ag-Cu-based brazing material layer was bonded to the headers of pins similar to those used in Example 28. In addition, an Ag-Cu-based brazing material layer was bonded to the lower surface of a Kovar seal frame. Subsequently, the brazing material layer of each of the pins was temporarily fixed on a pin bonding region by using a jig, and the brazing material layer of the seal frame was temporarily fixed on the frame-like pattern by using a jig. Thereafter, a heat treatment was performed in a nitrogen atmosphere (oxygen concentration = 15 ppm or less) in a belt furnace at a maximum temperature of 830° C., thereby bonding each of the pins on a pin bonding region and the seal frame on the flame-like pattern. By performing these manufacturing steps, two types of circuit boards having the structure shown in FIG. 2 were manufactured.

Each of the circuit boards of Examples 42 and 43 had the constitution of the pin bonding region and the brazing material layer formed thereon, and the circuit pattern, which were as is shown in Table 19 and obtained due to an effect of the heat treatment performed in the bonding step. Following the same procedures as in Example 28, a bonding strength of a circuit board obtained before the pin bonding step, a pin tensile strength of a pin bonding region, and characteristics (strength characteristics) obtained after the TCT were checked for each circuit board. In addition, a bonding strength of a circuit board of each circuit board, the presence/absence of peeling obtained by the peeling test, and characteristics (strength characteristics and peeling characteristics) obtained after the TCT were checked. The results are summarized in Table 19.

As is apparent from Tables 14 to 19 to be presented later, each of the circuit boards of Examples 32 to 43 in which the pins are bonded at a predetermined temperature to the pin bonding regions having a metal oxynitride layer represented by formula $Al_uM1_vM2_xO_yN_z$ (wherein M1 represents a metal selected from the group consisting of Ti, Ta, and Cr, M2 represents a metal selected from the group consisting of Ni, W, Mo, and Nb, u represents 3 to 50 atm%, v represents 3 to 78 atm%, x represents 0.0001 to 50 atm%, y represents 0.005 to 25 atm%, and z represents 5 to 70 atm%) has a high bonding strength of the pin with respect to the AlN substrate and causes no decrease in the bonding strength of the pin in the evaluation performed after 1,000 cycles of the TCT, i.e., has good characteristics. In addition, each of the circuit boards of Examples 32 to 43 obtained after the circuit pattern having the metal oxynitride layer is heated at the above temperature has a high bonding strength of the circuit pattern with respect to the AlN substrate and causes no decrease in strength nor peeling in the evaluation performed after 1,000 cycles of the TCT, i.e., has good characteristics.

In addition, in each of the circuit boards of Examples 32 to 43, the seal frame bonded to the frame-like pattern by the brazing material layer was bonded to the AlN substrate with high strength similarly to the lead pin.

EXAMPLES 44 & 45

Following the same procedures as in Example 1, lapping, polishing, wet cleaning, and reverse sputtering were performed on the surface of an AlN substrate having an oxygen content of 0.03 at% and a thermal conductivity of 270 W/m.K and having via fillings consisting of W. Undercoating layers were formed on the two surfaces of the substrate under the conditions listed in Table 20 to be presented later by using a sputter-deposition apparatus. Subsequently, without breaking the vacuum in the sputter-deposition apparatus, a main layer was formed on the undercoating layer under the conditions listed in Table 20.

Following the same procedures as in Example 22, the layers formed on the upper surface side of the substrate were selectively removed by etching to form a circuit pattern, a circuit pattern having a land portion at its end, and a frame-like pattern. In addition, following the same procedures as in Example 22, the layers formed on the lower surface side of the substrate were selectively etched to form pin bonding regions.

Subsequently, an Ag-Cu-based brazing material layer was bonded to the headers of pins similar to those used in Example 28. In addition, an Ag-Cu-based brazing material layer was bonded to the lower surface of a Kovar seal frame. Subsequently, the brazing material layer of each of the pins was temporarily fixed on a pin bonding region by using a jig, and the brazing material layer of the seal frame was temporarily fixed on the frame-like pattern by using a jig. Thereafter, a heat treatment was performed in a nitrogen atmosphere (oxygen concentration = 15 ppm or less) in a belt furnace at a maximum temperature of 830° C., thereby bonding each of the pins on a pin bonding region and the seal frame on the flame-like pattern. By performing these manufacturing steps, two types of circuit boards having the structure shown in FIG. 2 were manufactured.

Each of the circuit boards of Examples 44 and 45 had the constitution of the pin bonding region and the brazing material layer formed thereon, and the circuit pattern, which were as is shown in Table 20 and obtained due to an effect of the heat treatment performed in the bonding step. Following the same procedures as in Example 28, a bonding strength of a circuit board obtained before the pin bonding step, a pin tensile strength of a pin bonding region, and characteristics (strength characteristics) obtained after the TCT were checked for each circuit board. In addition, a bonding strength of a circuit board of each circuit board, the presence/absence of peeling obtained by the peeling test, and characteristics (strength characteristics and peeling characteristics) obtained after the TCT were checked. The results are summarized in Table 20.

EXAMPLES 46 & 47

Following the same procedures as in Example 1, lapping, polishing, wet cleaning, and reverse sputtering were performed on the surface of an AlN substrate having an oxygen content of 0.03 at% and a thermal conductivity of 270 W/m.K and having via fillings consisting of W. Undercoating layers were formed on the two surfaces of the substrate under the conditions listed in Table 21 to be presented by using a sputter-deposition apparatus. Subsequently, without breaking the vacuum in the sputter-deposition apparatus, a main layer was formed on the undercoating layer under the conditions listed in Table 21.

Following the same procedures as in Example 22, the layers formed on the upper surface side of the substrate were selectively removed by etching to form a circuit pattern, a circuit pattern having a land portion at its end, and a frame-like pattern. In addition, following the same procedures as in Example 22, the layers formed on the lower surface side of the substrate were selectively etched to form pin bonding regions.

Subsequently, an Ag-Cu-based brazing material layer was bonded to the headers of pins similar to those used in Example 28. In addition, an Ag-Cu-based brazing material layer was bonded to the lower surface of a Kovar seal frame. Subsequently, the brazing material layer of each of the pins was temporarily fixed on a pin bonding region by using a jig, and the brazing material layer of the seal frame was temporarily fixed on the frame-like pattern by using a jig. Thereafter, a heat treatment was performed in a nitrogen atmosphere (oxygen concentration = 15 ppm or less) in a bet furnace at a maximum temperature of 830° C., thereby bonding each of the pins on a pin bonding region and the seal frame on the flame-like pattern. By performing these manufacturing steps, two types of circuit boards having the structure shown in FIG. 2 were manufactured.

Each of the circuit boards of Examples 46 and 47 had the constitution of the pin bonding region and the brazing material layer formed thereon, and the circuit pattern, which were as is shown in Table 21 and obtained due to an effect of the heat treatment performed in the bonding step. Following the same procedures as in Example 28, a bonding strength of a circuit board obtained before the pin bonding step, a pin tensile strength of a pin bonding region, and characteristics (strength characteristics) obtained after the TCT were checked for each circuit board. In addition, a bonding strength of a circuit board of each circuit board, the presence/absence of peeling obtained by the peeling test, and characteristics (strength characteristics and peeling characteristics) obtained after the TCT were checked. The results are summarized in Table 21.

EXAMPLES 48 & 49

Following the same procedures as in Example 1, lapping, polishing, wet cleaning, and reverse sputtering were performed on the surface of an AlN substrate having an oxygen content of 0.03 at% and a thermal conductivity of 270 W/m.K and having via fillings consisting of W. Undercoating layers were formed on the two surfaces of the substrate under the conditions listed in Table 22 to be presented later by using a sputter-deposition apparatus. Subsequently, without breaking the vacuum in the sputter-deposition apparatus, a main layer was formed on the undercoating layer under the conditions listed in Table 22.

Following the same procedures as in Example 22, the layers formed on the upper surface side of the substrate were selectively removed by etching to form a circuit pattern, a circuit pattern having a land portion at its end, and a frame-like pattern. In addition, following the same procedures as in Example 22, the layers formed on the lower surface side of the substrate were selectively etched to form pin bonding regions.

Subsequently, an Ag-Cu-based brazing material layer was bonded to the headers of pins similar to those used in Example 28. In addition, an Ag-Cu-based brazing material layer was bonded to the lower surface of a, Kovar seal frame. Subsequently, the brazing material layer of each of the pins was temporarily fixed on a pin bonding region by using a jig, and the brazing material layer of the seal frame was temporarily fixed on the frame-like pattern by using a jig. Thereafter, a heat treatment was performed in a nitrogen atmosphere (oxygen concentration = 15 ppm or less) in a belt furnace at a maximum temperature of 830° C., thereby bonding each of the pins on a pin bonding region and the seal frame on the flame-like pattern. By performing these manufacturing steps, two types of circuit boards having the structure shown in FIG. 2 were manufactured.

Each of the circuit boards of Examples 48 and 49 had the constitution of the pin bonding region and the brazing material layer formed thereon, and the circuit pattern, which were as is shown in Table 22 and obtained due to an effect of the heat treatment performed in the bonding step. Following the same procedures as in Example 28, a bonding strength of a circuit board obtained before the pin bonding step, a pin tensile strength of a pin bonding region, and characteristics (strength characteristics) obtained after the TCT were checked for each circuit board. In addition, a bonding strength of a circuit board of each circuit board, the presence/absence of peeling obtained by the peeling test, and characteristics (strength characteristics and peeling characteristics) obtained after the TCT were checked. The results are summarized in Table 22.

As is apparent from Tables 20 to 22 to be presented later, each of the circuit boards of Examples 44 to 49 in which the pins are bonded at a temperature to the pin bonding regions having an undercoating layer represented by formula $Al_uM1_vM2_wAu_xO_yN_z$ (wherein M1 represents a metal selected from the group consisting of Ti, Cr, Ta, and Zr, M2 represents a metal selected from the group consisting of Ni, W, Nb, and Mo, u represents 0.1 to 40 atm%, v represents 0.5 to 50 atm%, w represents 0.1 to 50 atm%, x represents 0.05 to 30 atm%, y represents 0 to 20 atm%, and z represents 0.1 to 40 atm%) and a main layer represented by formula $M1_wM2_xAu_yO_z$ (wherein M1 represents a metal selected from the group consisting of Ti, Cr, Ta, and Zr, M2 represents a metal selected from the group consisting of Ni, W, Nb, and Mo, w represents 0.5 to 50 atm%, x represents 0.1 to 50 atm%, represents 0.1 to 80 atm%, and z represents 0 to 1.5 atm%) has a high bonding strength of the pin with respect to the AlN substrate and causes no decrease in the bonding strength of the pin in the evaluation performed after 1,000 cycles of the TCT, i.e., has good characteristics.

In addition, each of the circuit boards of Examples 44 to 49 obtained after the circuit pattern having the undercoating layer and the main layer is heated at the above temperature has a high bonding strength of the circuit pattern with respect to the AlN substrate and causes no decrease in strength nor peeling in the evaluation performed after 1,000 cycles of the TCT, i.e., has good characteristics.

In addition, in each of the circuit boards of Examples 44 to 49, the seal frame bonded to the frame-like pattern by the brazing material layer was bonded to the AlN substrate with high strength similarly to the lead pin.

As has been described above, since the circuit board according to the the present invention has a circuit pattern having good heat radiation properties and a high bonding strength with respect to an AlN substrate, it can be effectively used as a semiconductor package or a semiconductor module which can mount active elements such as IC chips or LSI chips at a high density.

In addition, since the circuit board according to the present invention has pins having good heat radiation properties and a high bonding strength with respect to an AlN substrate, it can be effectively used as a semiconductor package or a semiconductor module which can mount active elements such as IC chips or LSI chips at a high density.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept a defined by the appended claims and their equivalents.

TABLE 1

| | | Metal oxynitride layer | | | | |
| --- | --- | --- | --- | --- | --- | --- |
| | | | Film formation conditions by sputtering | | | |
| | Composition | Substrate temperature | Target | Gas atmosphere | Pressure | RF power |
| Example 1 | Al;20 atm %, Ti;65 atm %, O;1 atm %, N;14 atm % | 200° C. | AlN and Ti | Ar:O:N = 20:1:9 | 0.2 Pa | Maximum 400 W |
| Example 2 | Al;5 atm %, Ti;78 atm %, O;12 atm %, N;14 atm % | 400° C. | AlN and Ti | Ar:O:N = 3:2:1 | 1.0 Pa | Maximum 400 W |
| Example 3 | Al;50 atm %, Ti;4 atm %, O;25 atm %, N;31 atm % | 700° C. | AlN and Ti | Ar:O:N = 3:2:2 | 2.0 Pa | Maximum 100 W |
| Example 4 | Al;21 atm %, Ti;22 atm %, O;7 atm %, N;40 atm % | 400° C. | AlN and Ti | Ar:O:N = 35:1:20 | 2.0 Pa | Maximum 700 W |
| Example 5 | Al;45 atm %, Ti;10 atm %, O;20 atm %, N;25 atm % | 50° C. | AlN and Ti | Ar:O:N = 2:3:4 | 1.0 Pa | Maximum 500 W |
| Comparative Example 1 | Al;30 atm %, Ti;20 atm %, O;0 atm %, N;50 atm % | 250° C. | AlN and Ti | Ar:O:N = 2:0:5 | 1.5 Pa | Maximum 900 W |
| Comparative Example 2 | Al;49 atm %, Ti;1 atm %, O;21 atm %, N;29 atm % | 250° C. | AlN and Ti | Ar:O:N = 2:4:5 | 0.9 Pa | Maximum 400 W |

| | Arrangement of bonding layer/barrier layer/ conductor layer Numbers in parentheses represent thickness | Characteristics | |
| --- | --- | --- | --- |
| | | Bonding strength (kg/mm$^2$) | Characteristics after 1,000 cycles of TCT |
| Example 1 | Ti/Ni/Au (30 nm/400 nm/200 nm) | 31 | Strength not decreased Not peeled |
| Example 2 | Ti/Pt/Au (50 nm/500 nm/300 nm) | 29 | Strength not decreased Not peeled |
| Example 3 | Ti/Pd/Au (10 nm/300 nm/200 nm) | 27 | Strength not decreased Not peeled |
| Example 4 | Ti/Ni/Au (20 nm/400 nm/300 nm) | 28 | Strength not decreased Not peeled |
| Example 5 | Ti/Ni/Au (10 nm/500 nm/200 nm) | 29 | Strength not decreased Not peeled |
| Comparative Example 1 | Ti/Ni/Au (20 nm/500 nm/200 nm) | 1.5 | Strength decreased Peeled |
| Comparative Example 2 | Ti/Ni/Au (2 nm/300 nm/200 nm) | 1 | Strength decreased Peeled |

A multielement target was used as a target in sputtering conditions.

TABLE 2

| | Oxgen content/ thermal conductivity of AlN substrate | Metal oxynitride layer | | | | | |
| --- | --- | --- | --- | --- | --- | --- | --- |
| | | Composition Numbers in parentheses represent thickness | Film formation conditions by sputtering | | | | |
| | | | Substrate temperature | Target | Gas atmosphere | Pressure | RF power |
| Example 6 | 0.51 atm % 130 W/m · K | Al;5 atm %, Ti;45 atm %, Ni;10 atm %, O;25 atm %, N;15 atm %, (100 nm) | 25° C. | AlN, Ti, Ni | Ar:O:N = 10:1:5 | 1.0 Pa | 400~ 700 W |
| Example 7 | 0.20 atm % 220 W/m · K | Al;46 atm %, Ti;4 atm %, Ni;20 atm %, O;3 atm %, N;27 atm % (50 nm) | 300° C. | AlN, Ti, Ni | Ar:O:N = 50:1:75 | 0.8 Pa | 100~ 700 W |
| Example 8 | 0.01 atm % 240 W/m · K | Al;15 atm %, Ti;39 atm % Ni;1 atm %, O;10 atm %, N;35 atm % (100 nm) | 250° C. | AlN, Ti, Ni | Ar:O:N = 30:1:45 | 1.5 Pa | 100~ 700 W |
| Example 9 | 0.10 atm % 240 W/m · K | Al;35 atm %, Ti;30 atm % Ni;5 atm %, O;15 atm %, | 250° C. | AlN, Ti, Ni | Ar:O:N = 30:1:3 | 1.0 Pa | 100~ 600 W |

TABLE 2-continued

N;5 atm % (80 nm)

| | Arrangement of bonding layer/barrier layer/ conductor layer Numbers in parentheses represent thickness | Characteristics | |
|---|---|---|---|
| | | Bonding strength (kg/mm$^2$) | Characteristics after 1,000 cycles of TCT |
| Example 6 | Ti/Ni/Au (100 nm/400 nm/200 nm) | 26 | Strength not decreased Not peeled |
| Example 7 | Ti/Ni/Au (100 nm/500 nm/200 nm) | 27 | Strength not decreased Not peeled |
| Example 8 | Ti/Ni/Au (50 nm/500 nm/200 nm) | 29 | Strength not decreased Not peeled |
| Example 9 | Ti/Ni/Au (150 nm/300 nm/200 nm) | 28 | Strength not decreased Not peeled |

A multielement target was used as a target in sputtering conditions.

TABLE 3

| | Oxgen content/ thermal conductivity of AlN substrate | Metal oxynitride layer | | | | | |
|---|---|---|---|---|---|---|---|
| | | Composition | Film formation conditions by sputtering | | | | |
| | | Numbers in parentheses represent thickness | Substrate temperature | Target | Gas atmosphere | Pressure | RF power |
| Example 10 | 2.70 atm % 230 W/m·K | Al;32 atm %, Ti;3 atm %, Ni;50 atm %, O;2 atm %, N;13 atm %, (30 nm) | 300° C. | AlN, Ti, Ni | Ar:N = 1:1 | 1.0 Pa | 100~ 500 W |
| Example 11 | 0.05 atm % 260 W/m·K | Al;28 atm %, Ti;28 atm % Ni;4 atm %, O;1 atm %, N;49 atm % (15 nm) | 800° C. | AlN, Ti, Ni | Ar:N = 3:2 | 0.6 Pa | 100~ 500 W |
| Comparative Example 3 | 0.05 atm % 260 W/m·K | Al;0 atm %, Ti;4 atm %, Ni;46 atm %, O;36 atm %, N;14 atm % (80 nm) | 250° C. | AlN, Ti, Ni | Ar:O:N = 30:7:3 | 0.6 Pa | 100~ 500 W |
| Comparative Example 4 | 0.05 atm % 270 W/m·K | Al;40 atm %, Ti;1 atm %, Ni;10 atm %, O;4 atm %, N;25 atm % (50 nm) | 150° C. | AlN, Ti, Ni | Ar:O:N = 15:1:13 | 0.9 Pa | 100~ 600 W |
| Comparative Example 5 | 0.05 atm % 260 W/m·K | Al;25 atm %, Ti;30 atm % Ni;15 atm %, O;35 atm %, N;0 atm % (80 nm) | 260° C. | AlN, Ti, Ni | Ar:O = 8:3 | 0.7 Pa | 200~ 400 W |

| | Arrangement of bonding layer/barrier layer/ conductor layer Numbers in parentheses represent thickness | Characteristics | |
|---|---|---|---|
| | | Bonding strength (kg/mm$^2$) | Characteristics after 1,000 cycles of TCT |
| Example 10 | Ti/Pd/Au (50 nm/500 nm/1000 nm) | 38 | Strength not decreased Not peeled |
| Example 11 | Ti/Pt/Au (150 nm/300 nm/600 nm) | 51 | Strength not decreased Not peeled |
| Comparative Example 3 | Ti/Ni/Au (50 nm/500 nm/1000 nm) | 2 | Strength decreased Peeled |
| Comparative Example 4 | Ti/Ni/Au (50 nm/300 nm/2000 nm) | 1 | Strength decreased Peeled |
| Comparative Example 5 | Ti/Ni/Au (50 nm/500 nm/1000 nm) | 1 | Strength decreased Peeled |

A multielement target was used as a target in sputtering conditions.

TABLE 4

| | Oxgen content/ thermal conductivity of AlN substrate | Metal oxynitride layer | | | | | |
|---|---|---|---|---|---|---|---|
| | | Composition | Film formation conditions by sputtering | | | | |
| | | Numbers in parentheses represent thickness | Substrate temperature | Target | Gas atmosphere | Pressure | RF power |
| Example 12 | 0.03 atm % 270 W/m·K | Al;3 atm %, Ti;27 atm %, W;49 atm %, O;0.5 atm %, N;20.5 atm %, (10 nm) | 200° C. | AlN, Ti, W | Ar:O:N = 2:3:0.001 | 0.2 Pa | 200~ 400 W |
| Example 13 | 0.10 atm % 180 W/m·K | Al;40 atm %, Ti;35 atm %, W;1 atm %, O;1 atm %, N;23 atm % (32 nm) | 300° C. | AlN, Ti, W | Ar:O:N = 50:1:75 | 0.8 Pa | 100~ 700 W |
| Comparative Example 6 | 0.05 atm % 270 W/m·K | Al;10 atm %, Ti;10 atm % W;4 atm %, O;1 atm %, N;75 atm % (30 nm) | 200° C. | AlN, Ti, W | Ar:O:N = 2:3:0.5 | 0.2 Pa | 400~ 700 W |
| Comparative | 0.07 atm % | Al;45 atm %, Ti;4 atm % | 25° C. | AlN, | Ar:O:N = | 1.0 Pa | 100~ |

TABLE 4-continued

| | | | | | |
|---|---|---|---|---|---|
| Example 7 | 260 W/m · K | W;10 atm %, O;40 atm %, N;1 atm % (20 nm) | Ti, W | 1:1:1 | 600 W |

| | Arrangement of bonding layer/barrier layer/ conductor layer Numbers in parentheses represent thickness | Characteristics | |
|---|---|---|---|
| | | Bonding strength (kg/mm$^2$) | Characteristics after 1,000 cycles of TCT |
| Example 12 | Ti/W/Au (50 nm/500 nm/1.5 μm) | 31 | Strength not decreased Not peeled |
| Example 13 | Ti/W/Au (900 nm/600 nm/1.5 μm) | 27 | Strength not decreased Not peeled |
| Comparative Example 6 | Ti/W/Au (70 nm/500 nm/1.5 μm) | 4 | Strength decreased Peeled |
| Comparative Example 7 | Ti/W/Au (5 nm/500 nm/1.5 μm) | 3 | Strength decreased Peeled |

A multielement target was used as a target in sputtering conditions.

TABLE 5

| | Oxgen content/ thermal conduct- ivity of AlN substrate | Metal oxynitride layer | | | | | |
|---|---|---|---|---|---|---|---|
| | | Composition Numbers in paren- theses represent thickness | Film formation conditions by sputtering | | | | |
| | | | Substrate tem- perature | Target | Gas atmos- phere | Pressure | RF power |
| Example 14 | 0.03 atm % 270 W/m · K | Al;40 atm %, Ti;3 atm %, Mo;30 atm %, O;1 atm %, N;26 atm %, (10 nm) | 300° C. | AlN, Ti, Mo | Ar:O:N = 30:1:30 | 5.0 Pa | 200~ 400 W |
| Example 15 | 0.03 atm % 270 W/m · K | Al;40 atm %, Ti;30 atm % Nb;1 atm %, O;25 atm %, N;4 atm %, (10 nm) | 200° C. | AlN, Ti, Ta | Ar:O:N = 30:1:30 | 0.5 Pa | 100~ 600 W |
| Example 16 | 0.03 atm % 270 W/m · K | Al;40 atm %, Ti;45 atm % Nb;10 atm %, O;005 atm % N;4.995 atm % (5 nm) | 250° C. | AlN, Ti, Nb | Ar:O:N = 3000:1:300 | 1.0 Pa | 100~ 600 W |
| Example 17 | 0.03 atm % 270 W/m · K | Al;40 atm %, Cr;35 atm % W;25 atm %, O;1 atm %, N;4 atm % (10 nm) | 200° C. | AlN, Cr, W | Ar:O:N = 30:1:30 | 0.5 Pa | 100~ 600 W |

| | Arrangement of bonding layer/barrier layer/ conductor layer Numbers in parentheses represent thickness | Characteristics | |
|---|---|---|---|
| | | Bonding strength (kg/mm$^2$) | Characteristics after 1,000 cycles of TCT |
| Example 14 | Ti/Mo/Au (60 nm/500 nm/2.0 μm) | 30 | Strength not decreased Not peeled |
| Example 15 | Ti/Nb/Au (100 nm/200 nm/2.0 μm) | 40 | Strength not decreased Not peeled |
| Example 16 | Ti/Nb/Au (50 nm/500 nm/2.0 μm) | 28 | Strength not decreased Not peeled |
| Example 17 | Cr/W/Au (100 nm/200 nm/12 μm) | 40 | Strength not decreased Not peeled |

A multielement target was used as a target in sputtering conditions.

TABLE 6

| | Oxgen content/ thermal conduct- ivity of AlN substrate | Metal oxynitride layer | | | | | |
|---|---|---|---|---|---|---|---|
| | | Composition Numbers in paren- theses represent thickness | Film formation conditions by sputtering | | | | |
| | | | Substrate tem- perature | Target | Gas atmos- phere | Pressure | RF power |
| Example 18 | 0.03 atm % 270 W/m · K | Al;10 atm %, Zr;78 atm %, W;5 atm %, O;2 atm %, N;5 atm %, (100 nm) | 250° C. | AlN, Zr, W | Ar:O:N = 303:2:5 | 1.5 Pa | 100~ 700 W |
| Example 19 | 0.01 atm % 280 W/m · K | Al;45 atm %, Zr;40 atm %, Ni;5 atm %, O;5 atm %, N;5 atm % (50 nm) | 300° C. | AlN, Zr, Ni | Ar:O:N = 50:1:75 | 0.8 Pa | 100~ 700 W |
| Example 20 | 0.03 atm % 270 W/m · K | Al;3 atm %, Ta;27 atm % W;49 atm %, O;0.5 atm %, N;20.5 atm % (10 nm) | 200° C. | AlN, Ta, W | Ar:O:N = 2:3:0.001 | 0.2 Pa | 200~ 400 W |
| Example 21 | 0.03 atm % 270 W/m · K | Al;40 atm %, Ta;30 atm %, Mo;3 atm %, O;1 atm %, N;26 atm % (20 nm) | 300° C. | AlN. Ta, Mo | Ar:O:N = 300:1:350 | 5.0 Pa | 200~ 400 W |

Arrangement of bonding layer/barrier layer/

TABLE 6-continued

|  | conductor layer Numbers in parentheses represent thickness | Characteristics | |
|---|---|---|---|
|  |  | Bonding strength (kg/mm²) | Characteristics after 1,000 cycles of TCT |
| Example 18 | Zr/W/Au (50 nm/400 nm/2.0 μm) | 29 | Strength not decreased Not peeled |
| Example 19 | Zr/Ni/Au (100 nm/230 nm/2.0 μm) | 27 | Strength not decreased Not peeled |
| Example 20 | Ta/W/Au (50 nm/500 nm/1.5 μm) | 31 | Strength not decreased Not peeled |
| Example 21 | Ta/Mo/Au (60 nm/500 nm/2.0 μm) | 30 | Strength not decreased Not peeled |

A multielement target was used as a target in sputtering conditions.

TABLE 7

| | Upper column represents composition of undercoating layer. Numbers in parentheses represent thickness. Lower column represents composition of main layer. Number is parentheses represent thickness. | Film formation conditions by sputtering | | | Characteristics | |
|---|---|---|---|---|---|---|
| | | Substrate temperature | Target and gas atmosphere | Pressure and RF power | Bonding strength and peeling test | State after 1000 cycles of TCT |
| Example 22 | Al:6.5 atm %, Ti:0.5 atm %, Ni;50 atm %, Au;23 atm %, O;3 atm %, N;17 atm % (15 nm) | 100° C. | AlN, Ti Ni and Au Ar:O:N = 1:2:4 | 0.2 Pa 200~ 400 W | 27 kg/mm² Not peeled | Strength not decreased Not peeled |
| | Ti;20 atm %, Ni;30 atm %, Au;49 atm %, O;1 atm % (1.8 μm) | 100° C. | Ti, Ni and Au Ar:O:N = 1:2:4 | 0.2 Pa 200~ 400 W | | |
| Example 23 | Al;33 atm %, Zr;20 atm %, W:0.5 atm %, Au;6.5 atm %, O;12 atm %, N;12 atm % (8 nm) | 250° C. | AlN, Zr W and Au Ar:O:N = 2:1:7 | 1.0 Pa 200~ 500 W | 22 kg/mm² Not peeled | Strength not decreased Not peeled |
| | Zr:50 atm %, W;12 atm %, Au;37 atm %, O;1 atm % (1.8 μm) | 250° C. | Zr, W and Au Ar:O:N = 2:1:7 | 1.0 Pa 200~ 500 W | | |

A multielement target was used as a target in sputtering condition.

TABLE 8

| | Upper column represents composition of undercoating layer. Numbers in parentheses represent thickness. Lower column represents composition of main layer. Number in parentheses represent thickness. | Film formation conditions by sputtering | | | Characteristics | |
|---|---|---|---|---|---|---|
| | | Substrate temperature | Target and gas atmosphere | Presser and RF power | Bonding strength and peeling test | State after 1000 cycles of TCT |
| Example 24 | Al: 0.1 atm %, Ti; 22 atm %, Ni; 34 atm %, Au; 3.9 atm %, N; 40 atm % (50 nm) | 250° C. | AlN, Ti Ni and Au Ar:O:N = 2:0.01:5 | 1.5 Pa 400~ 500W | 24 kg/mm² Not peeled | Strength not decreased Not peeled |
| | Ti; 14.9 atm %, Ni; 20 atm %, Au; 56.9 atm %, O; 0.1 atm % (4500 nm) | 250° C. | Ti, Ni and Au Ar:O:N = 2:0.01:5 | 1.5 Pa 200~ 400W | | |
| Example 25 | Al; 5.95 atm %, Cr; 50 atm %, Nb; 12 atm %, Au; 8.05 atm %, N; 24 atm % (15 nm) | 200° C. | AlN, Cr Nb and Au Ar:O:N = 35:1:20 | 1.0 Pa 400~ 700W | 26 kg/mm² Not peeled | Strength not decreased Not peeled |
| | Cr: 8 atm %, Nb; 50 atm %, Au; 41 atm %, O; 1 atm % (1.2 μm) | 200° C. | Cr, Nb and Au Ar:O:N = 35:1:20 | 1.0 Pa 400~ 700W | | |

A multielement target was used as a target in sputtering condition.

TABLE 9

| | Upper column represents composition of undercoating layer. Numbers in parentheses represent thickness. Lower column represents composition of main layer. Number in parentheses represent thickness. | Film formation conditions by sputtering | | | Characteristics | |
|---|---|---|---|---|---|---|
| | | Substrate temperature | Target and gas atmosphere | Presser and RF power | Bonding strength and peeling test | State after 1000 cycles of TCT |
| Example 26 | Al: 32 atm %, Ta; 18 atm %, W; 27 atm %, Au; 12 atm %, N; 11 atm % (20 nm) | 250° C. | AlN, Ti W and Au AR:O:N = 3:0.01:5 | 1.5 Pa 400~ 500W | 21 kg/mm² Not peeled | Strength not decreased Not peeled |
| | Ta; 12 atm %, W; 39 atm %, Au; 49 atm % (800 nm) | 250° C. | Ta, W and Au Ar:O:N = 3:0.01:5 | 1.5 Pa 200~ 400W | | |
| Example 27 | Al; 24 atm %, Zr; 0.9 atm %, Mo; 34 atm %, Au; 23.1 atm %, N; 18 atm % (15 nm) | 150° C. | AlN, Zr Mo and Au Ar:O:N = 35:1:20 | 1.0 Pa 400~ 700W | 29 kg/mm² Not peeled | Strength not decreased Not peeled |
| | Zr: 10 atm %, Mo; 30 atm %, Au; 60 atm % (1.2 μm) | 150° C. | Zr, Mo and Au Ar:O:N = 35:1:20 | 1.0 Pa 400~ 700W | | |

A multielement target was used as a target in sputtering condition.

TABLE 10

| | Metal oxynitride layer | | | | Arrangement of bonding layer/barrier layer/ conductor layer Numbers in parentheses represent thickness | Bonding strength (kg/mm²) |
|---|---|---|---|---|---|---|
| | Composition Numbers in parentheses represent thickness | Film formation conditions by sputtering | | | | |
| | | Substrate temperature | Target and gas atmosphere | Presser and RF power | | |
| Example 28 | Al; 8 atm %, Ti; 45 atm %, O; 5 atm %, N; 42 atm % (10 nm) | 200° C. | AlN and Ti Ar:O:N = 20:1:9 | 1.1 Pa 200~ 400W | Ti/W/Au (70 nm/300 nm/ 1.5 μm) | 30 |
| Example 29 | Al; 20 atm %, Ti; 65 atm %, O; 1 atm %, N; 14 atm % (30 nm) | 100° C. | AlN and Ti Ar:O:N = 2:4:8 | 1.5 Pa 400~ 700W | Ti/Ni/Au (100 nm/400 nm/ 500 nm) | 35 |

| | | State after heat treatment (Upper column represents pin bonding region; numbers in parentheses represent thickness) (Lower column represents circuit pattern; numbers in parentheses represent thickness) | Characteristics Strength | Characteristics after 1,000 cycles of TCT |
|---|---|---|---|---|
| Example 28 | Undercoating layer | Al; 23.39 atm %, Ti; 35 atm %, W; 0.1 atm %, Cu; 0.01 atm %. O; 1.5 atm %, N; 40 atm % (50 nm) | Pin tensile strength | Strength not decreased |
| | Main layer | Ti; 2 atm %, W; 97.5 atm %, Cu; 0.5 atm % (350 nm) | | |
| | Wax material layer | Ag; 69 atm %, Cu; 19 atm %, Au 12 atm % (25 μm) | 65 kg/mm² | |
| | Undercoating layer | Al; 25 atm %, Ti; 33 atm %, W; 0.1 atm %; Au; 3.1 atm %, O; 0.8 atm %, N; 38 atm % (30 nm) | Bonding strength | Strength not decreased, Not peeled |
| | Main layer | Ti; 8 atm %, W; 38 atm %, Au; 52.5 atm %, O; 1.5 atm % (1.85 μm) | 54 kg/mm², Not peeled | |
| Example 29 | Undercoating layer | Al; 15 atm %, Ti; 33 atm %, Ni; 27 atm %, Cu; 1.5 atm %, O; 0.5 atm %, N; 23 atm % (60 nm) | Pin tensile strength | Strength not decreased |
| | Main layer | Ti; 10 atm %, Ni; 78 atm %, Cu; 12 atm % (400 nm) | | |
| | Wax material layer | Ag; 71.5 atm %, Cu; 27.5 atm %, Au; 1 atm % (24 μm) | 71 kg/mm² | |
| | Undercoating layer | Al; 18 atm %, Ti; 40 atm %, Ni; 23 atm %, Au; 6.7 atm %, O; 0.3 atm %, N; 12 atm % (40 nm) | Bonding strength | Strength not decreased, Not peeled |
| | Main layer | Ti; 0.8 atm %, Ni; 50 atm %, Au; 49 atm %, O; 0.2 atm % (960 nm) | 62 kg/mm², Not peeled | |

A multielement target was used as a target in sputtering condition.

TABLE 11

| | Metal oxynitride layer | | | | Arrangement of bonding layer/barrier layer/ conductor layer Numbers in parentheses represent thickness | Bonding strength (kg/mm²) |
|---|---|---|---|---|---|---|
| | Composition Numbers in parentheses represent thickness | Film formation conditions by sputtering | | | | |
| | | Substrate temperature | Target and gas atmosphere | Presser and RF power | | |
| Example 30 | Al; 5 atm %, Ta; 45 atm %, O; 5 atm %, N; 45 atm % (50 nm) | 300° C. | AlN and Ta Ar:O:N = 50:1:75 | 0.8 Pa 200~ 700W | Ta/W/Au (3 nm/500 nm/ 1.5 μm) | 27 |
| Example | Al; 50 atm %, Cr; 44 atm %, | 25° C. | AlN and Cr | 1.0 Pa | Cr/Nb/Au | 23 |

TABLE 11-continued

| 31 | O; 2 atm %, N; 4 atm % (50 nm) | | Ar:O:N = 10:3:15 | 400~ 700W | (50 nm/10 nm/ 200 nm) | |
|---|---|---|---|---|---|---|

| | | State after heat treatment (Upper column represents pin bonding region; numbers in parentheses represent thickness) (Lower column represents circuit pattern; numbers in parentheses represent thickness) | Characteristics Strength | Characteristics after 1,000 cycles of TCT |
|---|---|---|---|---|
| Example 30 | Undercoating layer | Al; 0.3 atm %, Ta; 29 atm %, W; 29 atm %, Cu; 0.6 atm %, O; 1.1 atm %, N; 40 atm % (80 nm) | Pin tensile strength | Strength not decreased |
| | Main layer | Ta; 49.9 atm %, W; 49.9 atm %, Cu; 0.2 atm % (200 nm) | | |
| | Wax material layer | Ag; 60 atm %, Cu; 19 atm %, Au 21 atm % (25 μm) | 67 kg/mm² | |
| | Undercoating layer | Al; 0.5 atm %, Ta; 19 atm %, W; 19 atm %; Au; 30 atm %, O; 0.5 atm %, N; 31 atm % (65 nm) | Bonding strength 52 kg/mm², | Strength not decreased, |
| | Main layer | Ta; 25 atm %, W; 25 atm %, Au; 49.4 atm %, O; 0.6 atm % (2.215 μm) | Not peeled | Not peeled |
| Example 31 | Undercoating layer | Al; 25 atm %, Cr; 34.59 atm %, Nb; 0.1 atm %, Cu; 0.01 atm %, O; 1.3 atm %, N; 39 atm % (60 nm) | Pin tensile strength | Strength not decreased |
| | Main layer | Cr; 12 atm %, Nb; 80 atm %, Cu; 8 atm % (300 nm) | 60 kg/mm² | |
| | Wax material layer | Ag; 90 atm %, Cu; 2 atm %, Au; 8 atm % (25.5 μm) | | |
| | Undercoating layer | Al; 35 atm %, Cr; 42 atm %, Nb; 0.1 atm %, Au; 0.05 atm %, O; 0.9 atm %, N; 21.95 atm % (60 nm) | Bonding strength 50 kg/mm², | Strength not decreased, |
| | Main layer | Cr; 9 atm %, Nb; 10 atm %, Au; 80 atm %, O; 1 atm % (2.4 μm) | Not peeled | Not peeled |

A multielement target was used as a target in sputtering condition.

TABLE 12

| | Metal oxynitride layer | | | | Arrangement of bonding layer/barrier layer/ | |
|---|---|---|---|---|---|---|
| | | Film formation conditions by sputtering | | | | |
| | Composition Numbers in parentheses represent thickness | Substrate temperature | Target and gas atmosphere | Presser and RF power | conductor layer Numbers in parentheses represent thickness | Bonding strength (kg/mm²) |
| Comparative Example 8 | Al; 50 atm %, Ti; 1 atm %, O; 23 atm %, N; 26 atm % (20 nm) | 25° C. | AlN and Ti Ar:O:N = 2:1:1 | 1.0 Pa 400~ 700W | Ti/W/Au (3 nm/500 nm/ 1.5 μm) | 1.0 |
| Comparative Example 9 | Al; 7 atm %, Ti; 82 atm %, O; 1 atm %, N; 10 atm % (30 nm) | 200° C. | AlN and Ti Ar:O:N = 2:4:8 | 1.5 Pa 100~ 700W | Ti/Ni/Au (50 nm/10 nm/ 200 nm) | 0.8 |

| | | State after heat treatment (Upper column represents pin bonding region; numbers in parentheses represent thickness) (Lower column represents circuit pattern; numbers in parentheses represent thickness) | Characteristics Strength | Characteristics after 1,000 cycles of TCT |
|---|---|---|---|---|
| Comparative Example 8 | Undercoating layer | Al; 25 atm %, Ti; 0.05 atm %, W; 33 atm %, Cu; 1 atm %, O; 0.95 atm %, N; 40 atm % (4 nm) | Pin tensile strength | Strength decreased |
| | Main layer | Ti; 0.5 atm %, W; 79 atm %, Cu; 20.5 atm % (520 nm) | | |
| | Wax material layer | Ag; 70 atm %, Cu; 19 atm %, Au; 11 atm % (25 μm) | 0.8 kg/mm² | Pin tensile strength 0.4 kg/mm² |
| | Undercoating layer | Al; 31 atm %, Ti; 0.2 atm %, W; 34 atm %, Au; 4 atm %, O; 0.8 atm %, N; 30 atm % (5 nm) | Bonding strength 0.7 kg/mm², | Strength decreased, Bonding strength |
| | Main layer | Ti; 0.05 atm %, W; 45 atm %, Au; 1 atm %, O; 53.95 atm %, (1.7 μm) | Peeled | 0.3 kg/mm², Peeled |
| Comparative Example 9 | Undercoating layer | Al; 5 atm %, Ti; 56 atm %, Ni; 31 atm %, Cu; 1 atm %, O; 1 atm %, N; 6 atm % (40 nm) | Pin tensile strength | Strength decreased |
| | Main layer | Ti; 58 atm %, Ni; 10 tm %; Cu; 32 atm % (50 nm) | | Pin tensile |
| | Wax material layer | Ag; 71 atm %, Cu; 27 atm %, Au; 2 atm % (24 μm) | 0.6 kg/mm² | strength 0.3 kg/mm² |
| | Undercoating layer | Al; 4 atm %, Ti; 64 atm %, Ni; 23 atm %, Au; 2 atm %, O; 1 atm %, N; 6 atm % (40 nm) (60 nm) | Bonding strength 0.4 kg/mm², | Strength decreased, Bonding |
| | Main layer | Ti; 56 atm %, Ni; 10 atm %, Au; 10 atm %, O; 24 atm % (250 nm) | Peeled | strength 0.2 kg/mm², Peeled |

A multielement target was used as a target in sputtering condition.

TABLE 13

| | Metal oxynitride layer | Arrangement of bonding |
|---|---|---|
| | Film formation conditions by | |

TABLE 13-continued

| | Composition Numbers in parentheses represent thickness | sputtering | | | layer/barrier layer/ conductor layer Numbers in parentheses represent thickness | Bonding strength (kg/mm²) |
|---|---|---|---|---|---|---|
| | | Substrate temperature | Target and gas atmosphere | Presser and RF power | | |
| Comparative Example 10 | Al; 0.5 atm %, Ti; 68 atm %, O; 30 atm %, N; 1.5 atm % (5 nm) | 50° C. | AlN and Ti Ar:O:N = 2:3:4 | 1.5 Pa 100~ 700W | Ti/W/Au (50 nm/ 200 nm/2 μm) | 0.6 |
| Comparative Example 11 | Al; 85 atm %, Ti; 10 atm %, O; 2 atm %, N; 3 atm % (20 nm) | 150° C. | AlN and Ti Ar:O:N = 30:1:150 | 1.0 Pa 100~ 600W | Ti/W/Au (50 nm/ 200 nm)/2 μm | 1.2 |

| | State after heat treatment (Upper column represents pin bonding region; numbers in parentheses represent thickness) (Lower column represents circuit pattern; numbers in parentheses represent thickness) | | Characteristics | |
|---|---|---|---|---|
| | | | Strength | Characteristics after 1,000 cycles of TCT |
| Comparative Example 10 | Undercoating layer | Al; 0.05 atm %, Ti; 58 atm %, W; 14.35 atm %, Cu; 1.5 atm %, O; 18 atm %, N; 8.1 atm % (10 nm) | Pin tensile strength | Strength decreased |
| | Main layer | Ti; 38.6 atm %, W; 51.2 atm %, Cu; 10.2 atm % (245 nm) | | Pin tensile strength |
| | Wax material layer | Ag; 65 atm %, Cu; 17 atm %, Au; 18 atm % (25 μm) | 0.3 kg/mm² | 0.1 kg/mm² |
| | Undercoating layer | Al; 0.05 atm %, Ti; 56 atm %, W; 8 atm %, Au; 5.95 atm %, O; 28 atm %, N; 2 atm % (15 nm) | Bonding strength | Strength decreased, Bonding strength |
| | Main layer | Ti; 18 atm %, W; 25 atm %, Au; 54 atm %, O; 3 atm %, (2.24 μm) | 0.2 kg/mm², Peeled | 0.1 kg/mm², Peeled |
| Comparative Example 11 | Undercoating layer | Al; 46 atm %, Ti; 9 atm %, Ni; 12.2 atm %, Cu; 0.8 atm %, O; 31 atm %, N; 1 atm % (20 nm) | Pin tensile strength | Strength decreased Pin tensile |
| | Main layer | Ti; 34 atm %, W; 58 tm %; Cu; 8 atm % (300 nm) | 0.8 kg/mm² | strength |
| | Wax material layer | Ag; 70 atm %, Cu; 18 atm %, Au; 12 atm % (25.5 μm) | | 0.2 kg/mm² |
| | Undercoating layer | Al; 70 atm %, Ti; 9.2 atm %, W; 10 atm %, Au; 2 atm %, O; 0.3 atm %, N; 8.5 atm % (25 nm) | Bonding strength | Strength decreased, Bonding |
| | Main layer | Ti; 8 atm %, W; 24 atm %, Au; 66 atm %, O; 2 atm % (2.45 μm) | 1.0 kg/mm², Peeled | strength 0.4 kg/mm², Peeled |

A multielement target was used as a target in sputtering condition.

TABLE 14

| | Metal oxynitride layer | | | | Arrangement of bonding layer/barrier layer/ conductor layer Numbers in parentheses represent thickness | Bonding strength (kg/mm²) |
|---|---|---|---|---|---|---|
| | Composition Numbers in parentheses represent thickness | Film formation conditions by sputtering | | | | |
| | | Substrate temperature | Target and gas atmosphere | Presser and RF power | | |
| Example 32 | Al; 21 atm %, Ti; 27 atm %, Ni; 13 atm %, O; 10 atm %, N; 29 atm % (5 nm) | 200° C. | AlN, and Ni Ar:O:N = 2:3:1 | 1.0 Pa 200~ 400W | Ti/Ni/Au (700 nm/500 nm/ 700 nm) | 28 |
| Example 33 | Al; 3 atm %, Ti; 27 atm %, W; 49 atm %, O; 0.5 atom %, N; 20.5 atm % (10 nm) | 200° C. | AlN, and W Ar:O:N = 2:3:0.5 | 0.2 Pa 200~ 400W | Ti/W/Au (50 nm/800 nm/ 1.5 μm) | 32 |

| | State after heat treatment (Upper column represents pin bonding region; numbers in parentheses represent thickness) (Lower column represents circuit pattern; numbers in parentheses represent thickness) | | Characteristics | |
|---|---|---|---|---|
| | | | Strength | Characteristics after 1,000 cycles of TCT |
| Example 32 | Undercoating layer | Al; 18 atm %, Ti; 14.5 atm %, Ni; 49 atm %, Cu; 0.6 atm %, O; 1 atm %, N; 16.9 atm % (12 nm) | Pin tensile strength | Strength not decreased |
| | Main layer | Ta; 14 atm %, Ni; 46 atm %, Cu; 40 atm % (565 nm) | | |
| | Wax material layer | Ag; 82 atm %, Cu; 6 atm %, Au; 12 atm % (25 μm) | 58 kg/mm² | |
| | Undercoating layer | Al; 12 atm %, Ti; 18.5 atm %, Ni; 26 atm %; Au; 21.7 atm %, O; 0.8 atm %, N; 21 atm % (8 nm) | Bonding strength | Strength not decreased, |
| | Main layer | Ti; 1.2 atm %, Ni; 18.2 atm %, Au; 80 atm %, O; 0.6 atm % (17 μm) | 51 kg/mm², Not peeled | Not peeled |
| Example 33 | Undercoating layer | Al; 3 atm %, Ti; 23 atm %, W; 48 atm %, Cu; 0.5 atm %, O; 0.6 atm %, N; 24.9 atm % (20 nm) | Pin tensile strength | Strength not decreased |
| | Main layer | Cr; 18 atm %, W; 78 atm %, Cu; 4 atm % (560 nm) | | |
| | Wax material layer | Ag; 66 atm %, Cu; 18 atm %, Au; 16 atm % (25 μm) | 64 kg/mm² | |
| | Undercoating layer | Al; 1.8 atm %, Ti; 31 atm %, W; 47 atm %, Au; 7.6 atm %, O; 0.6 atm %, N; 12 atm % (30 nm) | Bonding strength | Strength not |

TABLE 14-continued

| | | | |
|---|---|---|---|
| Main layer | Ti; 10 atm %, W; 48 atm %, Au; 40.6 atm %, O; 1.4 atm % (2.7 nm) | 48 kg/mm², Not peeled | decreased, Not peeled |

A multielement target was used as a target in sputtering condition.

TABLE 15

| | Metal oxynitride layer | | | Arrangement of bonding layer/barrier layer/ | |
|---|---|---|---|---|---|
| | | Film formation conditions by sputtering | | | |
| | Composition Numbers in parentheses represent thickness | Substrate temperature | Target and gas atmosphere | Presser and RF power | conductor layer Numbers in parentheses represent thickness | Bonding strength (kg/mm²) |
| Example 34 | Al; 43 atm %, Zr; 41 atm %, W; 5 atm %, O; 6 atm % N; 5 atm % (25 nm) | 250° C. | AlN, Zr and W Ar:O:N = 50:1:70 | 0.8 Pa 100~ 700W | Zr/W/Au (30 nm/ 230 nm/2 μm) | 22 |
| Example 35 | Al; 40 atm %, Cr; 30 atm %, Mo; 23 atm %, O; 2 atm % N; 5 atm % (10 nm) | 300° C. | AlN, Cr and Mo Ar:O:N = 30:1:30 | 0.5 Pa 100~ 600W | Cr/Mo/Au (100 nm/ 200nm/10 μm) | 24 |

| | | State after heat treatment (Upper column represents pin bonding region; numbers in parentheses represent thickness) (Lower column represents circuit pattern; numbers in parentheses represent thickness) | Characteristics Strength | Characteristics after 1,000 cycles of TCT |
|---|---|---|---|---|
| Example 34 | Undercoating layer | Al; 24 atm %, Zr; 28 atm %, W; 11.1 atm %, Cu; 0.5 atm %, O; 0.4 atm %, N; 36 atm % (25 nm) | Pin tensile strength 51 kg/mm² | Strength not decreased |
| | Main layer | Zr; 18 atm %, W; 58 atm %, Cu; 24 atm % (260 nm) | | |
| | Wax material layer | Ag; 90 atm %, Cu; 2 atm %, Au; 8 atm % (25 μm) | | |
| | Undercoating layer | Al; 38 atm %, Zr; 21 atm %, W; 8 atm %; Au; 7 atm %, O; 0.4 atm %, N; 25.6 atm % (20 nm) | Bonding strength 42 kg/mm², Not peeled | Strength not decreased, Not peeled |
| | Main layer | Zr; 10 atm %, W; 48 atm %, Au; 41 atm %, O; 1 atm % (2.26 μm) | | |
| Example 35 | Undercoating layer | Al; 20 atm %, Cr; 26.6 atm %, Mo; 20.1 atm %, Cu; 1.1 atm %, O; 0.2 atm %, N; 32 atm % (15 nm) | Pin tensile strength 47 kg/mm² | Strength not decreased |
| | Main layer | Cr; 21.7 atm %, Mo; 78 atm %, Cu; 0.3 atm % (300 nm) | | |
| | Wax material layer | Ag; 48 atm %, Cu; 2 atm %, Au; 50 atm % (25 μm) | | |
| | Undercoating layer | Al; 21 atm %, Cr; 16 atm %, Mo; 49 atm %, Au; 1.6 atm %, O; 0.4 atm %, N; 12 atm % (250 nm) | Bonding strength 38 kg/mm², Not peeled | Strength not decreased, Not peeled |
| | Main layer | Cr; 2 atm %, Mo; 18.4 atm %, Au; 79 atm %, O; 0.6 atm % (10.06 μm) | | |

A multielement target was used as a target in sputtering condition.

TABLE 16

| | Metal oxynitride layer | | | Arrangement of bonding layer/barrier layer/ | |
|---|---|---|---|---|---|
| | | Film formation conditions by sputtering | | | |
| | Composition Numbers in parentheses represent thickness | Substrate temperature | Target and gas atmosphere | Presser and RF power | conductor layer Numbers in parentheses represent thickness | Bonding strength (kg/mm²) |
| Example 36 | Al; 16 atm %, Ti; 48 atm %, O; 0.3 atm % N; 35.7 atm % (5 nm) | 200° C. | Al N, Ti Ar:O:N = 2:0.001:1 | 0.2 Pa 200~ 400 W | Ti/W/Au (40 nm/ 500 nm/1.5 μm) | 30 |
| Example 37 | Al; 50 atm %; Ta; 40 atm %, O; 0.1 atm % N; 10 atm % (20 nm) | 200° C. | Al N, Ta Ar:O:N = 10:0.01:15 | 1.0 Pa 200~ 400 W | Ta/Nb/Au (50 nm/ 500 nm/2 μm) | 29 |

| | | State after heat treatment (Upper column represents pin bonding region; numbers in parentheses represent thickness) (Lower column represents circuit pattern; numbers in parentheses represent thickness) | Characteristics Strength | Characteristics state after 1,000 cycles of TCT |
|---|---|---|---|---|
| Example 36 | Undercoating layer | Al; 12 atm %, Ti; 32.6 atm %, W; 28.4 atm %, Cu; 0.1 atm %, N; 26.9 atm % (10 nm) | Pin tensile strength 62 kg/mm² | Strength not decreased |
| | Main layer | Ti; 8 atm %, W; 61 atm %, Cu; 31 atm % (540 nm) | | |
| | Wax material layer | Ag; 82 atm %, Cu; 6 atm %, Au; 12 atm % (25 μm) | | |
| | Undercoating layer | Al; 12 atm %, Ti; 24.6 atm %, W; 26 atm %, Au; 16 atm %, N; 21.4 atm % (8 nm) | Bonding strength 58 kg/mm², Not peeled | Strength not decreased, Not peeled |
| | Main layer | Ti; 6 atm %, W; 43 atm %, Au; 50 atm %, O; 1 atm % (1.7 μm) | | |
| Example | Undercoating | Al; 22 atm %, Ta; 29 atm %, Nb; 14 atm %, | Pin | Strength |

TABLE 16-continued

| | | | | |
|---|---|---|---|---|
| 37 | layer | Cu; 0.3 atm %, N; 34.7 atm % (20 nm) | tensile | not |
| | Main layer | Ta; 17 atm %, Nb; 77 atm %, Cu; 6 atm % (550 nm) | strength | decreased |
| | Wax material layer | Ag; 68 atm %, Cu; 24 atm %, Au; 8 atm % (25 μm) | 60 kg/mm$^2$ | |
| | Undercoating layer | Al; 28 atm %, Ta; 40 atm %, Nb; 12 atm %, Au; 2 atm %, N; 18 atm % (30 nm) | Bonding strength | Strength not |
| | Main layer | Ta; 21 atm %, Nb; 34 atm %, Au; 44 atm %, O; 1 atm % (2.7 μm) | 52 kg/mm$^2$, Not peeled | decreased, Not peeled |

A multielement target was used as a target in sputtering condition.

TABLE 17

| | Metal oxynitride layer | | | | | |
|---|---|---|---|---|---|---|
| | Composition Numbers in parentheses represent thickness | Film formation conditions by sputtering | | | Arrangement of bonding layer/barrier layer/ conductor layer Numbers in parentheses represent thickness | Bonding strength (kg/mm$^2$) |
| | | Substrate temperature | Target and gas atmosphere | Presser and RF power | | |
| Example 38 | Al; 32 atm %, Ti; 41.995 atm %, O; 0.005 atm %, N; 26 atm % (10 nm) | 250° C. | Al N, Ti Ar:O:N = 30:1:45 | 1.0 Pa 200~ 600 W | Ti/W/Au (50 nm/ 500 nm/1.0 μm) | 31 |
| Example 39 | Al; 25 atm %; Ta; 43 atm %, O; 0.01 atm %, N; 31.99 atm % (10 nm) | 300° C. | Al N, Ta Ar:O:N = 25:0.1:8 | 2.0 Pa 200~ 400 W | Ta/Mo/Au (60 nm/ 500 nm/2 μm) | 26 |

| | | | | Characteristics | |
|---|---|---|---|---|---|
| | | State after heat treatment (Upper column represents pin bonding region; numbers in parentheses represent thickness) (Lower column represents circuit pattern; numbers in parentheses represent thickness) | | Strength | Characteristics after 1,000 cycles of TCT |
| Example 38 | Undercoating layer | Al; 13 atm %, Ti; 32.4 atm %, W; 15 atm %, Cu; 0.6 atm %, N; 39 atm % (10 nm) | | Pin tensile strength 62 kg/mm$^2$ | Strength not decreased |
| | Main layer | Ti; 6 atm %, W; 76 atm %, Cu; 18 atm % (550 nm) | | | |
| | Wax material layer | Ag; 70 atm %, Cu; 18 atm %, Au; 12 atm % (25.4 μm) | | | |
| | Undercoating layer | Al; 18 atm %, Ti; 32 atm %, W; 10 atm %, Au; 10 atm %, N; 30 atm % (12 nm) | | Bonding strength 49 kg/mm$^2$, Not peeled | Strength not decreased, Not peeled |
| | Main layer | Ti; 7 atm %, W; 32 atm %, Au; 61 atm %, (1.55 μm) | | | |
| Example 39 | Undercoating layer | Al; 24 atm %, Ta; 34.5 atm %, Mo; 0.2 atm %, Cu; 1.3 atm %, N; 40 atm % (20 nm) | | Pin tensile strength 53 kg/mm$^2$ | Strength not decreased |
| | Main layer | Ta; 12 atm %, Mo; 79 atm %, Cu; 9 atm % (550 nm) | | | |
| | Wax material layer | Ag; 62 atm %, Cu; 25 atm %, Au; 13 atm % (25.5 μm) | | | |
| | Undercoating layer | Al; 19 atm %, Ta; 42 atm %, Mo; 0.2 atm %, Au; 14.6 atm %, N; 24.2 atm % (25 nm) | | Bonding strength 48 kg/mm$^2$, Not peeled | Strength not decreased, Not peeled |
| | Main layer | Ta; 1 atm %, Mo; 28 atm %, Au; 71 atm %, (2.55 μm) | | | |

A multielement target was used as a target in sputtering condition.

TABLE 18

| | Metal oxynitride layer | | | | | |
|---|---|---|---|---|---|---|
| | Composition Numbers in parentheses represent thickness | Film formation conditions by sputtering | | | Arrangement of bonding layer/barrier layer/ conductor layer Numbers in parentheses represent thickness | Bonding strength (kg/mm$^2$) |
| | | Substrate temperature | Target and gas atmosphere | Presser and RF power | | |
| Example 40 | Al; 30 atm %, Ti; 45 atm % Ni; 10 atm %, O; 0.005 atm %, N; 14.995 atm % (10 nm) | 250° C. | Al N, Ti and Ni Ar:O:N = 20:2:15 | 1.0 Pa 100~ 700 W | Ti/Ni/Au (50 nm/ 500 nm/500 nm) | 30 |
| Example 41 | Al; 4 atm %; Ta; 24 atm %, W; 46 atm %, L; 0.01 atm %, N; 25.99 atm % (6 nm) | 300° C. | Al N, Ta and W Ar:O:N = 25:0.1:8 | 2.0 Pa 200~ 600 W | Ta/W/Au (50 mn/ 600 nm/1.5 μm) | 27 |

| | | | Characteristics | |
|---|---|---|---|---|
| | | State after heat treatment (Upper column represents pin bonding region; numbers in parentheses represent thickness) (Lower column represents circuit pattern; numbers in parentheses represent thickness) | Strength | Characteristics after 1,000 cycles of TCT |
| Example 40 | Undercoating layer | Al; 18 atm %, Ti; 32.5 atm %, Ni; 10 atm %, Cu; 1.2 atm %, N; 38.3 atm % (10 nm) | Pin tensile | Strength not |

TABLE 18-continued

|  |  |  |  |  |
|---|---|---|---|---|
|  | Main layer | Ti; 9 atm %, Ni; 76 atm %, Cu; 15 atm % (550 nm) | strength 62 kg/mm$^2$ | decrease |
|  | Wax material layer | Ag; 71 atm %, Cu; 27 atm %, Au; 3 atm % (24.5 μm) |  |  |
|  | Undercoating layer | Al; 23 atm %, Ti; 35 atm %, Ni; 16 atm %, Au; 9 atm %, N; 17 atm % (12 nm) | Bonding strength 50 kg/mm$^2$, Not peeled | Strength not decreased, Not peeled |
|  | Main layer | Ti; 1 atm %, Ni; 48 atm %, Au; 50.5 atm %, O; 0.5 atm % (1.05 μm) |  |  |
| Example 41 | Undercoating layer | Al; 4 atm %, Ta; 24 atm %, W; 42 atm %, Cu; 0.5 atm %, N; 29.5 atm % (20 nm) | Pin tensile strength 53 kg/mm$^2$ | Strength not decreased |
|  | Main layer | Ta; 8 atm %, W; 75 atm %, Cu; 17 atm % (550 nm) |  |  |
|  | Wax material layer | Ag; 64 atm %, Cu; 12 atm %, Au; 24 atm % (25 μm) |  |  |
|  | Undercoating layer | Al; 2 atm %, Ta; 25 atm %, W; 46 atm %, Au; 15 atm %, N; 12 atm % (25 nm) | Bonding strength 47 kg/mm$^2$, Not peeled | Strength not decreased, Not peeled |
|  | Main layer | Ta; 8 atm %, W; 46 atm %, Au; 45 atm %, O; 1 atm % (2.13 μm) |  |  |

A multielement target was used as a target in sputtering condition.

TABLE 19

| | Metal oxynitride layer | | | | |
|---|---|---|---|---|---|
| | Composition Numbers in parentheses represent thickness | Film formation conditions by sputtering | | | Arrangement of bonding layer/barrier layer/ |
| | | Substrate temperature | Target and gas atmosphere | Presser and RF power | conductor layer Numbers in parentheses represent thickness | Bonding strength (kg/mm$^2$) |
| Example 42 | Al; 44 atm %, Ti; 36 atm % Nb; 10 atm %, O; 0.01 atm %, N; 9.09 atm % (5 nm) | 250° C. | Al N, Ti and Nb Ar:O:N = 30:1:3 | 1.0 Pa 100~ 600 W | Ti/Nb/Au (40 nm/ 200 nm/100 nm) | 24 |
| Example 43 | Al; 40 atm %, Zr; 3 atm %, Mo; 30 atm %, O; 0.005 atm %, N; 26.995 atm % (20 nm) | 300° C. | Al N, Zr and Mo Ar:O:N = 25:0.1:8 | 2.0 Pa 200~ 400 W | Za/Mo/Au (60 nm/ 500 nm/2 μm) | 23 |

| | | | | Characteristics | |
|---|---|---|---|---|---|
| | | State after heat treatment (Upper column represents pin bonding region; numbers in parentheses represent thickness) (Lower column represents circuit pattern; numbers in parentheses represent thickness) | | Strength | Characteristics after 1,000 cycles of TCT |
| Example 42 | Undercoating layer | Al; 22 atm %, Ti; 34 atm %, Nb; 30 atm %, Cu; 0.4 atm %, N; 13.6 atm % (10 nm) | | Pin tensile strength 48 kg/mm$^2$ | Strength not decrease |
|  | Main layer | Ti; 10 atm %, Nb; 68 atm %, Cu; 22 atm % (235 nm) | | | |
|  | Wax material layer | Ag; 90 atm %, Cu; 4 atm %, Au; 6 atm % (24 μm) | | | |
|  | Undercoating layer | Al; 36 atm %, Ti; 22 atm %, Nb; 14 atm %, Au; 8 atm %, N; 20 atm % (12 nm) | | Bonding strength 42 kg/mm$^2$, Not peeled | Strength not decreased, Not peeled |
|  | Main layer | Ti; 12 atm %, Nb; 24 atm %, Au; 64 atm % (335 nm) | | | |
| Example 43 | Undercoating layer | Al; 14 atm %, Zr; 3 atm %, Mo; 43 atm %, Cu; 0.01 atm %, N; 39.99 atm % (30 nm) | | Pin tensile strength 51 kg/mm$^2$ | Strength not decreased |
|  | Main layer | Zr; 49 atm %, Mo; 50.5 atm %, Cu; 0.5 atm % (550 nm) | | | |
|  | Wax material layer | Ag; 60 atm %, Cu; 30 atm %, Au; 10 atm % (25 μm) | | | |
|  | Undercoating layer | Al; 26 atm %, Zr; 0.8 atm %, Mo; 38 atm %, Au; 20 atm %, N; 15.2 atm % (25 nm) | | Bonding strength 47 kg/mm$^2$, Not peeled | Strength not decreased, Not peeled |
|  | Main layer | Zr; 11 atm %, Mo; 34 atm %, Au; 55 atm % (2.55 μm) | | | |

A multielement target was used as a target in sputtering condition.

TABLE 20

| | Upper column represents composition of undercoating layer. Numbers in parentheses represent thickness. Lower column represents composition of main layer. Number in parentheses represent thickness. | Film formation conditions by sputtering | | | |
|---|---|---|---|---|---|
| | | Substrate Temperature | Target and gas atmosphere | Pressure and RF power | Bonding strength (kn/mm$^2$) |
| Example 44 | Al; 40 atm %, Ti; 22 atm %, Ni; 10 atm %, Au; 2 atm %, O; 6 atm %, N; 20 atm % (30 nm) | 250° C. | Al N, Ti Ni and Au Ar:O:N = 35:1:20 | 1.5 Pa 400~ 700 A | 32 |
| | Ti; 0.5 atm %, Ni; 19 atm %, Au; 79 atm %, O; 1.5 atm % (800 nm) | 250° C. | Ti, Ni and Au Ar:O:N = 35:1:20 | 1.5 Pa 400~ 700 W | |
| Example 45 | Al; 28 atm %, Zr; 26.5 atm %, W; 10 atm %, Au; 1 atm %, O; 4.5 atm %, | 250° C. | Al N, Zr W and Au | 1.0 Pa 100~ | 24 |

TABLE 20-continued

|  |  |  |  |  |
|---|---|---|---|---|
|  | Ni; 30 atm %<br>(20 nm)<br>Zr; 6 atm %, W; 24 atm %,<br>Au; 69 atm %, O; 1 atm %,<br>(1.5 μm) |  | 250° C. | Ar:O:N =<br>2:1:5<br>Zr, W and Au<br>Ar:O:N =<br>2:1:5 | 600 W<br>1.0 Pa<br>100~<br>600 W |

|  |  | State after heat treatment<br>(Upper column represents pin bonding region;<br>numbers in parentheses represent thickness)<br>(Lower column represents circuit pattern;<br>numbers in parentheses represent thickness) | Characteristics Strength | Characteristics after 1,000 cycles of TCT |
|---|---|---|---|---|
| Example 44 | Undercoating layer | Al; 28 atm %, Ti; 18 atm %, Ni; 24 atm %, Cu; 0.6 atm %, O; 0.4 atm %, N; 29 atm % (40 nm) | Pin tensile strength 45 kg/mm² | Strength not decrease |
|  | Main layer | Ti; 12 atm %, Ni; 68 atm %, Cu; 20 atm % (500 nm) |  |  |
|  | Wax material layer | Ag; 68 atm %, Cu; 24 atm %, Au; 8 atm % (23.8 μm) |  |  |
|  | Undercoating layer | Al; 36 atm %, Ti; 20 atm %, Ni; 12 atm %, Au; 16 atm %, O: 2 atm %, N; 14 atm % (20 nm) | Bonding strength 32 kg/mm², Not peeled | Strength not decreased, Not peeled |
|  | Main layer | Ti; 0.8 atm %, Ni; 30 atm %, Au; 68.2 atm %, O; 1.0 atm % (810 μm) |  |  |
| Example 45 | Undercoating layer | Al; 24.8 atm %, Zr; 0.6 atm %, W; 35 atm %, Cu; 0.6 atm %, O; 1 atm %, N: 38 atm % (30 nm) | Pin tensile strength 44 kg/mm² | Strength not decreased |
|  | Main layer | Zr; 8 atm %, W; 70 atm %, Cu; 22 atm % (300 nm) |  |  |
|  | Wax material layer | Ag; 72 atm %, Cu; 16 atm %, Au; 12 atm % (24.5 μm) |  |  |
|  | Undercoating layer | Al; 26 atm %, Zr; 30 atm %, W; 21 atm %, Au; 4 atm %, O; 1 atm %, N; 18 atm % (20 nm) | Bonding strength 24 kg/mm², Not peeled | Strength not decreased, Not peeled |
|  | Main layer | Zr; 12 atm %, W; 29 atm %, Au; 58.5 atm %, O; 0.5 atm % (2.55 μm) |  |  |

A multielement target was used as a target in sputtering conditions.

TABLE 21

|  | Upper column represents composition of undercoating layer. Numbers in parentheses represent thickness. Lower column represents composition of main layer. Number in parentheses represent thickness. | Film formation conditions by sputtering | | | Bonding strength (kn/mm²) |
|---|---|---|---|---|---|
|  |  | Substrate Temperature | Target and gas atmosphere | Pressure and RF power |  |
| Example 46 | Al; 4 atm %, Ti; 34 atm %, W; 22 atm %, Au; 5 atm %, N; 35 atm %<br>(30 nm) | 100° C. | Al N, Ti W and Au Ar:O:Au = 2:0.01:5 | 1.5 Pa 400~ 500 W | 25 |
|  | Ti; 24 atm %, W; 9 atm %, Au; 66.5 atm %, O; 0.5 atm %<br>(800 nm) | 100° C. | Ti, W and Au Ar:O:N = 2:0.01:5 | 1.5 Pa 400~ 500 W |  |
| Example 45 | Al; 22 atm %, Cr; 34 atm %, Ni; 17 atm %, Au; 6 atm %, N; 21 atm %,<br>(20 μm) | 200° C. | Al N, Cr Ni and Au Ar:O:N = 20:0.1:34 | 1.0 Pa 100~ 600 W | 24 |
|  | Cr; 1 atm %, Ni; 48 atm %, Au; 50 atm %, O; 1 atm %,<br>(1.5 μm) | 200° C. | Cr, Ni and Au Ar:O:N = 20:0.1:34 | 1.0 Pa 100~ 600 W |  |

|  |  | State after heat treatment<br>(Upper column represents pin bonding region;<br>numbers in parentheses represent thickness)<br>(Lower column represents circuit pattern;<br>numbers in parentheses represent thickness) | Characteristics Strength | Characteristics after 1,000 cycles of TCT |
|---|---|---|---|---|
| Example 46 | Undercoating layer | Al; 18 atm %, Ti; 32 atm %, W; 26 atm %, Cu; 0.2 atm %, N; 23.8 atm % (20 nm) | Pin tensile strength 53 kg/mm² | Strength not decrease |
|  | Main layer | Ti; 4 atm %, W; 58 atm %, Cu; 38 atm % (500 nm) |  |  |
|  | Wax material layer | Ag; 89 atm %, Cu; 2 atm %, Au; 9 atm % (23.9 μm) |  |  |
|  | Undercoating layer | Al; 8 atm %, Ti; 30 atm %, W; 27 atm %, Au; 7 atm %, N; 28 atm % (30 nm) | Bonding strength 25 kg/mm², Not peeled | Strength not decreased, Not peeled |
|  | Main layer | Ti; 20 atm %, W; 7 atm %, Au; 72 atm %, O; 1 atm % (800 μm) |  |  |
| Example 47 | Undercoating layer | Al; 24 atm %, Cr; 32 atm %, Ni; 34 atm %, Cu; 1.2 atm %, N; 8.8 atm % (30 nm) | Pin tensile strength 42 kg/mm² | Strength not decreased |
|  | Main layer | Cr; 48 atm %, Ni; 12 atm %, Cu; 40 atm % (200 nm) |  |  |
|  | Wax material layer | Ag; 36 atm %, Cu; 48 atm %, Au; 16 atm % (25 μm) |  |  |
|  | Undercoating layer | Al; 30 atm %, Cr; 30 atm %, Ni; 12 atm %, Au; 6 atm %, N; 22 atm % (25 nm) | Bonding strength 24 kg/mm², decreased, | Strength not |
|  | Main layer | Cr; 2 atm %, Ni; 56 atm %, Au; 40.5 atm %, |  |  |

TABLE 21-continued

| | | |
|---|---|---|
| O; 1.5 atm % (1.5 μm) | Not peeled | Not peeled |

A multielement target was used as a target in sputtering conditions.

TABLE 22

| | Upper column represents composition of undercoating layer. Numbers in parentheses represent thickness. Lower column represents composition of main layer. Number in parentheses represent thickness. | Film formation conditions by sputtering | | | Bonding strength (kn/mm$^2$) |
|---|---|---|---|---|---|
| | | Substrate Temperature | Target and gas atmosphere | Pressure and RF power | |
| Example 48 | Al; 8.5 atm %, Ta; 48 atm %, Mo; 16 atm %, Au; 0.05 atm %, N; 27.45 atm % (10 nm) | 250° C. | Al N, Ta Mo and Au Ar:O:N = 35:1:20 | 1.5 Pa 400~ 700 A | 20 |
| | Ta; 24 atm %, Mo; 48 atm %, Au; 27 atm %, (800 nm) | 250° C. | Ta, Mo and Au Ar:O:N = 35:1:20 | 1.5 Pa 400~ 700 W | |
| Example 49 | Al; 32 atm %, Cr; 18 atm %, Nb; 27 atm %, Au; 12 atm %, N; 11 atm %, (20 nm) | 200° C. | Al N, Ti Ni and Au Ar:O:N = 2:0.01:7 | 1.0 Pa 100~ 600 W | 27 |
| | Cr; 14 atm %, Nb; 37 atm %, Au; 59 atm %, (0.1 μm) | 200° C. | Ti, Ni and Au Ar:O:N = 20:0.0:7 | 1.0 Pa 100~ 600 W | |

| | | State after heat treatment (Upper column represents pin bonding region; numbers in parentheses represent thickness) (Lower column represents circuit pattern; numbers in parentheses represent thickness) | Characteristics | |
|---|---|---|---|---|
| | | | Strength | Characteristics after 1,000 cycles of TCT |
| Example 48 | Undercoating layer | Al; 15 atm %, Ta; 34 atm %, Mo; 36 atm %, Cu; 0.01 atm %, N; 14.99 atm % (15 nm) | Pin tensile strength 40 kg/mm$^2$ | Strength not decrease |
| | Main layer | Ta; 32 atm %, Mo; 32 atm %, Cu; 36 atm % (500 nm) | | |
| | Wax material layer | Ag; 50 atm %, Cu; 34 atm %, Au; 16 atm % (23.9 μm) | | |
| | Undercoating layer | Al; 12 atm %, Ta; 49 atm %, Mo; 12 atm %, Au; 0.1 atm %. O; 0.5 atm %, N; 26.4 atm % (10 nm) | Bonding strength 20 kg/mm$^2$, Not peeled | Strength not decreased, Not peeled |
| | Main layer | Ta; 30 atm %, Mo; 40 atm %, Au; 29 atm %, O; 1 atm % (800 μm) | | |
| Example 49 | Undercoating layer | Al; 18.2 atm %, Cr; 28.4 atm %, Nb; 28 atm %, Cu; 0.8 atm %, N; 24.6 atm % (30 nm) | Pin tensile strength 52 kg/mm$^2$ | Strength not decreased |
| | Main layer | Cr; 15.5 atm %, Nb; 78 atm %, Cu; 6.5 atm % (500 nm) | | |
| | Wax material layer | Ag; 70 atm %, Cu; 26 atm %, Au; 4 atm % (25 μm) | | |
| | Undercoating layer | Al; 30 atm %, Cr; 12 atm %, Nb; 31 atm %, Au; 26 atm %, O; 0.1 atm %, N; 0.9 atm % (20 nm) | Bonding strength 27 kg/mm$^2$, Not peeled | Strength not decreased, Not peeled |
| | Main layer | Cr; 20 atm %, Nb; 16 atm %, Au; 63.5 atm % O; 0.5 atm % (1 μm) | | |

A multielement target was used as a target in sputtering conditions.

What is claimed is:

1. A circuit board comprising:
an aluminum nitride substrate; and
a circuit pattern formed on said substrate and having a multilayered structure in which a metal oxynitride layer represented by formula $Al_uM1_vM2_xO_yN_z$ (wherein M1 represents a metal selected from the group consisting of Ti, Cr, Ta, and Zr, M2 represents a metal selected from the group consisting of Ni, Pt, Pd, W, Nb, and Mo, u represents 3 to 50 atm%, v represents 3 to 78 atm%, x represents 0 to 50 atm%, y represents 0.005 to 25 atm%, and z represents 5 to 70 atm%), a bonding layer consisting essentially of a metal represented by M1, a barrier layer consisting essentially of a metal represented by M2, and a conductor layer consisting essentially of Au are stacked in the order named.

2. The circuit board according to claim 1, wherein said metal oxynitride layer is represented by formula $Al_uM1_vO_yN_z$ (wherein M1, u, v, y, and z have the same meanings as described in claim 1).

3. The circuit board according to claim 1, wherein said metal oxynitride layer consists of a material represented by formula $Al_uTi_vO_yN_z$ (wherein u, v, y, and z have the same meanings as described in claim 1), said bonding layer consists of Ti, and said barrier layer consists of Ni.

4. The circuit board according to claim 1, wherein said metal oxynitride layer is represented by formula $Al_uM1_vM2_xO_yN_z$ (wherein M1, M2, u, v, y and z have the same meanings as described in claim 1, and x represents 0.0001 to 50 atm%).

5. The circuit board according to claim 1, wherein said metal oxynitride layer consists of a material represented by formula $Al_uTi_vNi_xO_yN_z$ (wherein u, v, y, and z have the same meanings as described in claim 1, and x represents 0.0001 to 50 atm%), said bonding layer consists of Ti, and said barrier layer consists of Ni.

6. A circuit board comprising:
an aluminum nitride substrate; and
a circuit pattern formed on said substrate and having a multilayered structure in which an undercoating layer represented by formula $Al_uM1_vM2_wAu_xO_yN_z$ (wherein M1 represents a metal selected from the group consisting of Ti, Cr, Ta, and Zr, M2 represents a metal selected from the group consisting of Ni, Pt, Pd, W, Nb, and Mo, u represents 0.1 to 40 atm%, v represents 0.5 to 50 atm%, w represents 0.1 to 50 atm%, x represents 0.05 to 30 atm%, y represents 0 to 20 atm%, and z represents 0.1 to 40 atm%) and a main layer represented by formula $M1_wM2_xAu_yO_z$ (wherein M1 represents a metal selected from the group consisting of Ti, Cr, Ta, and Zr, M2 represents a metal selected from the group consisting of Ni, Pt, Pd, W, Nb, and Mo, w represents 0.5 to 50 atm%, x represents 0.1 to 50 atm%, y represents 0.1 to 80 atm%, and z represents 0 to 1.5 atm%) are stacked in the order named.

7. The circuit board according to claim 6, wherein said undercoating layer is represented by formula $Al_uM1_vM2_wAu_xN_z$ (wherein M1, M2, u, v, w, x, and z have the same meanings as described in claim 6).

8. The circuit board according to claim 7, wherein said undercoating layer is represented by formula $Al_uTi_vNi_wAu_xN_z$ (wherein u, v, w, z, and z have the same meanings as described in claim 6).

9. The circuit board according to claim 6, wherein said undercoating layer is represented by formula $Al_uM1_wAu_xO_yN_z$ (wherein M1, M2, u, v, w, x, and z have the same meanings as described in claim 6, and y represents 0.0001 to 20 atm%).

10. The circuit board according to claim 9, wherein said undercoating layer is represented by formula $Al_uTi_vNi_wAu_xO_yN_z$ (wherein u, v, w, x, and z have the same meanings as described in claim 6, and y represents 0.0001 to 20 atm%).

11. The circuit board according to claim 6, wherein said main layer is represented by formula $M1_wM2_xAu_y$ (wherein M1, M2, w, x, and y have the same meanings as described in claim 6).

12. The circuit board according to claim 11, wherein said main layer is represented by formula $Ti_wNi_xAu_y$ (wherein w, x, and y have the same meanings as described in claim 6).

13. The circuit board according to claim 6, wherein said main layer is represented by formula $M1_wM2_xAu_yO_z$ (wherein M1, M2, w, x, and y have the same meanings as described in claim 6, and z represents 0.0001 to 1.5 atm%).

14. The circuit board according to claim 13, wherein said main layer is represented by formula $Ti_wNi_xAu_yO_z$ (wherein w, x, and y have the same meanings as described in claim 6 and z represents 0.0001 to 1.5 atm%.

15. A circuit board comprising:

an aluminum nitride substrate;

a lead bonding region having a multilayered structure which is formed on said substrate and in which an undercoating layer represented by formula $Al_uM1_vM2_wCu_xO_yN_z$ (wherein M1 represents a metal selected from the group consisting of Ti, Cr, Ta, and Zr, M2 represents a metal selected from the group consisting of Ni, Pt, Pd, W, Nb, and Mo, u represents 0.1 to 25 atm%, v represents 0.2 to 35 atm%, w represents 0.1 to 50 atm%, x represents 0.005 to 1.5 atm%, y represents 0 to 1.5 atm%, and z represents 0.5 to 40 atm%) and a main layer represented by formula $M1_xM2_yCu_z$ (wherein M1 represents a metal selected from the group consisting of Ti, Cr, Ta, and Zr, M2 represents a metal selected from the group consisting of Ni, Pt, Pd, W, Nb, and Mo, x represents 1 to 50 atm%, y represents 10 to 80 atm%, z represents 0.2 to 40 atm%) are stacked in the order named;

a circuit pattern formed on said substrate and electrically connected to said lead bonding region;

a brazing material layer bonded on said main layer of said lead bonding region and represented by formula $Ag_xCu_yAu_z$ (wherein x represents 5 to 90 atm%), y represents 1 to 50 atm%, and z represents 1 to 50 atm%); and a lead bonded on said brazing material layer.

16. The circuit board according to claim 15, wherein said undercoating layer is represented by formula $Al_uM1_vM2_wCu_xN_z$ (wherein M1, M2, u, v, w, x, and z have the same meanings as described in claim 15).

17. The circuit board according to claim 16, wherein said undercoating layer is represented by formula $Al_uTi_vNi_wCu_xN_z$ (wherein u, v, w, x, and z have the same meanings as described in claim 15).

18. The circuit board according to claim 15, wherein said undercoating layer is represented by formula $Al_uM1_vM2_wCu_xO_yN_z$ (wherein M1, M2, u, v, w, x, and z have the same meanings as described in claim 15, and y represents 0.0001 to 1.5 atm%).

19. The circuit board according to claim 18, wherein said undercoating layer is represented by formula $Al_uTi_vNi_wCu_xO_yN_z$ (wherein u, v, w, x, and z have the same meanings as described in claim 15, and y represents 0.0001 to 1.5 atm%).

20. The circuit board according to claim 15, wherein a frame-like pattern having a multilayered structure in which said undercoating layer and said main layer are stacked in the order named is formed on the surface of said AlN substrate, said brazing material layer is bonded on said frame-like pattern, and a seal frame is bonded on said brazing material layer.

* * * * *

UNITED STATES PATENT AND TRADEMARK OFFICE
CERTIFICATE OF CORRECTION

PATENT NO. : 5,041,700

DATED : August 20, 1991

INVENTOR(S) : Kiyoshi Iyogi et al.

It is certified that error appears in the above-identified patent and that said Letters Patent is hereby corrected as shown below:

On the title page, item [30]:
    The priority data is incorrect, should be,

--Sept. 27, 1989   [JP]   Japan..............1-249080

Sept. 14, 1990   [JP]   Japan ..............2-242451--.

Signed and Sealed this

Twenty-seventh Day of April, 1993

*Attest:*

MICHAEL K. KIRK

*Attesting Officer*   Acting Commissioner of Patents and Trademarks